United States Patent [19]

Horan

[11] 4,283,784

[45] Aug. 11, 1981

[54] MULTIPLE TIME ZONE, ALARM AND USER PROGRAMMABLE CUSTOM WATCH

[75] Inventor: Douglas F. Horan, Los Gatos, Calif.

[73] Assignee: Timex Corporation, Waterbury, Conn.

[21] Appl. No.: 904,228

[22] Filed: May 9, 1978

[51] Int. Cl.[3] ........................ G04C 19/00; G04C 3/00; H03K 19/08

[52] U.S. Cl. ........................................ 368/87; 368/155; 368/217; 307/473

[58] Field of Search ........................ 58/4 A, 192, 21.13, 58/23 R, 38 R, 38 A, 39.5, 58, 74, 85.5, 152 R, 152 B, 42.5-44; 340/336, 324 R; 307/214, 238, 269, 209; 368/10, 72, 73, 85-87, 155, 217-219

[56] References Cited

U.S. PATENT DOCUMENTS

| | | | |
|---|---|---|---|
| 3,828,278 | 8/1974 | Rees | 307/214 |
| 3,829,713 | 8/1974 | Canning | 307/214 |
| 3,912,947 | 10/1975 | Buchanan | 307/214 |
| 4,063,409 | 12/1977 | Bayliss | 58/50 R |
| 4,068,461 | 1/1978 | Fassett et al. | 58/23 |
| 4,125,993 | 11/1978 | Emile | 368/82 |

*Primary Examiner*—Vit W. Miska
*Attorney, Agent, or Firm*—William C. Crutcher

[57] ABSTRACT

An integrated circuit watch which employs a RAM and PLA to execute its timekeeping functions can be significantly improved to include a multiplicity of zones without entailing greater complexity of circuitry or large amounts of chip space and may incorporate user programmability by incorporation of the present invention. The number of independent and distinct watch functions within the integrated circuit watch can be increased by coupling a flag RAM to the main PLA. The flag bits, which are associated with the counting states of each separate watch function are then accessibily stored within the flag RAM and appropriately coupled to the main PLA to execute the required timekeeping operation at the appropriate time. A processor is coupled to the flag RAM and may selectively process or manipulate each of the flag bits in the flag RAM in response to instructions or control signals, some of which may be user initiated. User programmability may be incorporated by generating time delay request signals in a control circuit when any one of the watch zones is in a given state. After a specific timed delay as determined by a particular time delay request signal, a time delay reset signal is generated by the control circuitry. If upon the occurrence of the time delay reset signal, one or more other events also occur, such as the closure of a selected switch, the control circuitry can be configured in a predetermined state independently selected from the sequential plurality of states which the control circuitry would normally assume.

37 Claims, 15 Drawing Figures

SI ADVANCES DIGITS COUNT AS LONG AS DEPRESSED

MULTIPLE TIME ZONE, ALARM AND USER PROGRAMMABLE CUSTOM WATCH

BACKGROUND OF THE INVENTION

1. Field of the Invention

The present invention relates to the field of electronic watch circuits and more particularly to integrated watch circuits incorporating an alarm, multiple time zone watches, and user programmable features.

2. Prior Art

Conventional integrated circuit watch counters are typically based upon series of frequency counters which are used for counting and storing time for display. Proper carries, adjustments for seconds, minutes, hours, days, months and years are made by means of gated couplings among the various counters. Typically, selected counter outputs are decoded within the circuitry and are coupled to the inputs of a comparative circuit which activates an alarm upon a selected coincidence event, such as shown and described in U.S. Pat. No. 3,946,549.

In a related patent, U.S. Pat. No. 4,063,409, directed to a Custom Watch, assigned to the same assignee of the present invention, a watch was described in which a random access memory (RAM) is coupled to and controlled by a programmable logic array (PLA) in order to keep time. This architecture allows a wide variety of different function watches and chronographs to be easily designed within a single circuit architecture without requiring the circuit architecture to be redesigned with each separate version of the integrated circuit watch. In such a watch the PLA was controlled by and hardwired to a RAM, thereby having a control sequence dictated by a custom designed master control circuit.

What is needed then is some means for permitting the programmability of control of an integrated circuit watch whose operative functions are based upon the combination of a RAM and PLA to more flexibly include user programmed control sequences and to include an alarm and multiple time zone watches without undue circuit complexity or large demands for chip space.

BRIEF SUMMARY OF THE INVENTION

The present invention is a timekeeping circuit in an integrated circuit watch which has a main random access memory (main RAM) for storing binary words and has a PLA coupled to the main RAM to execute the timekeeping operations or functions. For example, the PLA and RAM in combination selectively increment one of the binary words stored in the RAM, compare the selected binary word to a limit value, generate a carry signal if appropriate, and generate an output binary word which is then restored in the main RAM. The timekeeping circuit of the present invention comprises a flag random access memory (flag RAM) and a flag processor. The flag RAM is coupled to the PLA and selectively stores a plurality of sets of flag bits. The flag bits are selectively coupled to the PLA for use during the selective timekeeping function, that is during the selective incrementation, comparison, generation of the carry signal, and generation of the output binary word. The flag processor is coupled to the flag RAM to process the plurality of sets of flag bits in response to at least one instruction. As a result of this combination, a plurality of watch modes and functions are efficiently organized within the integrated circuit watch in the minimum amount of chip space. Furthermore, this combination allows user programmability to be easily included and executed within the integrated circuit watch.

The timekeeping circuit may also comprise a control means for selectively generating a plurality of address control signals for the flag processor and flag RAM. The control means generates the plurality of address control signals in response to at least one user instruction. In the presently illustrated embodiment the plurality instructions which are provided to the control means are combinations of timed and sequenced activations of a plurality of switches, typically timed closures of selected switches.

In particular, the control means may include a plurality of state counters wherein each of the state counters generate a set of state signals indicative to a watch mode. Time delay request signals may be generated in response to selected ones of the state signals which are generated by the state counters in the control means. The control means may also include a time delay means which generates a time delay reset signal after a selected delay. A time delay reset signal is generated to correspond to each of the time delay request signals generated by one of the state counters. The time delay reset signal configures a selected state counter to a predetermined state.

The timekeeping circuit of the present invention also employs a unique means for generating an audible alarm signal. The audible alarm is generated by a piezoelectric transducer which has a first and second terminal. The first and second terminal are coupled to a means for driving those terminals with a low voltage, out-of-phase signal, in response to an alarm enable signal generated by the control means. Otherwise, the means for driving the first and second terminals of the transducer fix the first and second terminals at a substantially equal voltage. Thus, it has been found possible to fabricate an alarm transducer without the use of high voltages or excitation coils or capacitors typical of the prior art.

The present invention also includes a method for keeping time in a multiplicity of zones in an integrated circuit watch having a main RAM for storing a plurality of binary words and having a PLA coupled to the main RAM to implement timekeeping functions. The method of the present invention comprises the steps of selectively accessing a set of flag bits or a plurality of flag bits corresponding to one of the multiplicity of zones. The flag bits are stored in a flag RAM which is coupled to the PLA. The accessed set of flag bits is then processed in a processor coupled to the flag RAM in response to a plurality of instruction signals from the PLA and from a control means for generating at least some of the instruction signals. The processed and accessed set of flag bits is then coupled to the PLA for use in the timekeeping functions. As a result of the combination of these steps, a multiplicity of independent timekeeping functions can be accommodated by a single integrated circuit watch without increased complexity of circuitry or undue use of additional chip space.

These and other aspects of the present invention may be better understood by viewing the following FIGURES in light of the detailed description of the preferred embodiments.

Figure 3:
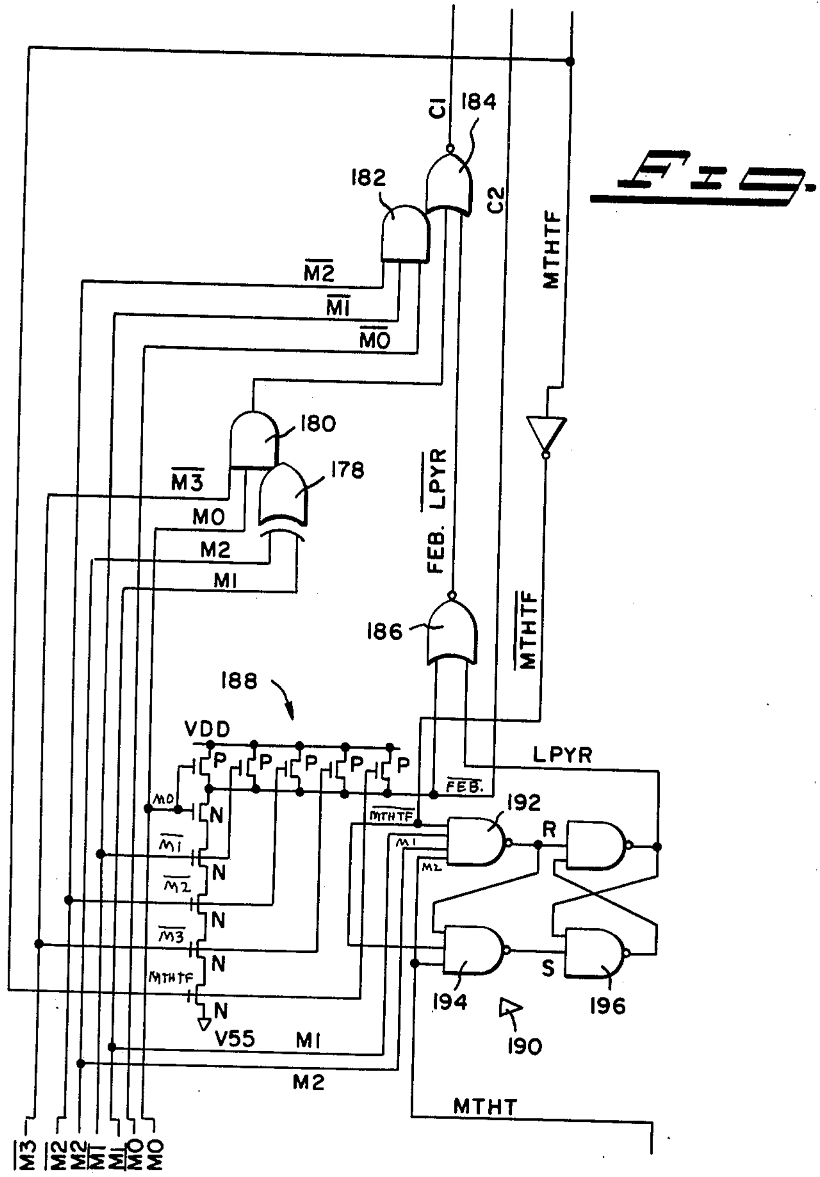

FIGS. *2a* and *2b* are schematic diagrams showing a flag processor and flag RAM coupled to a PLA according to the present invention;

FIG. 3 illustrates a calendar correction circuit which is used in combination with the flag processor and flag RAM of FIGS. *2a* and *2b;*

Figure 9:
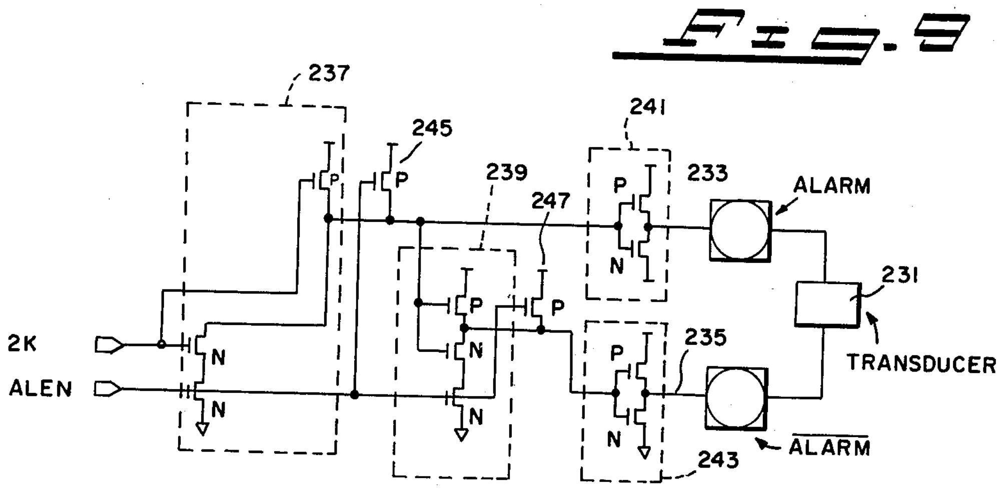
Figure 4:
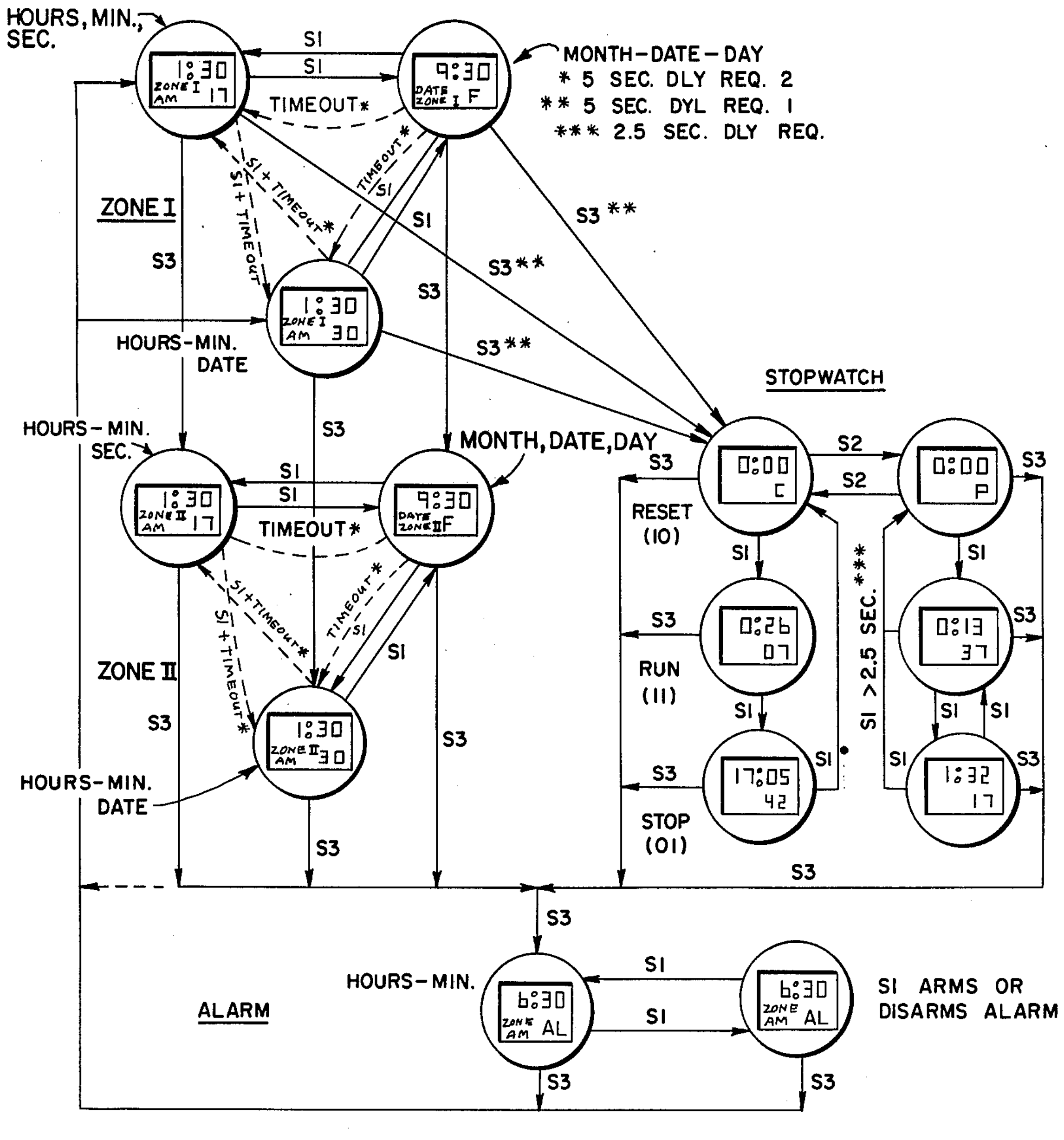
Figure 5:
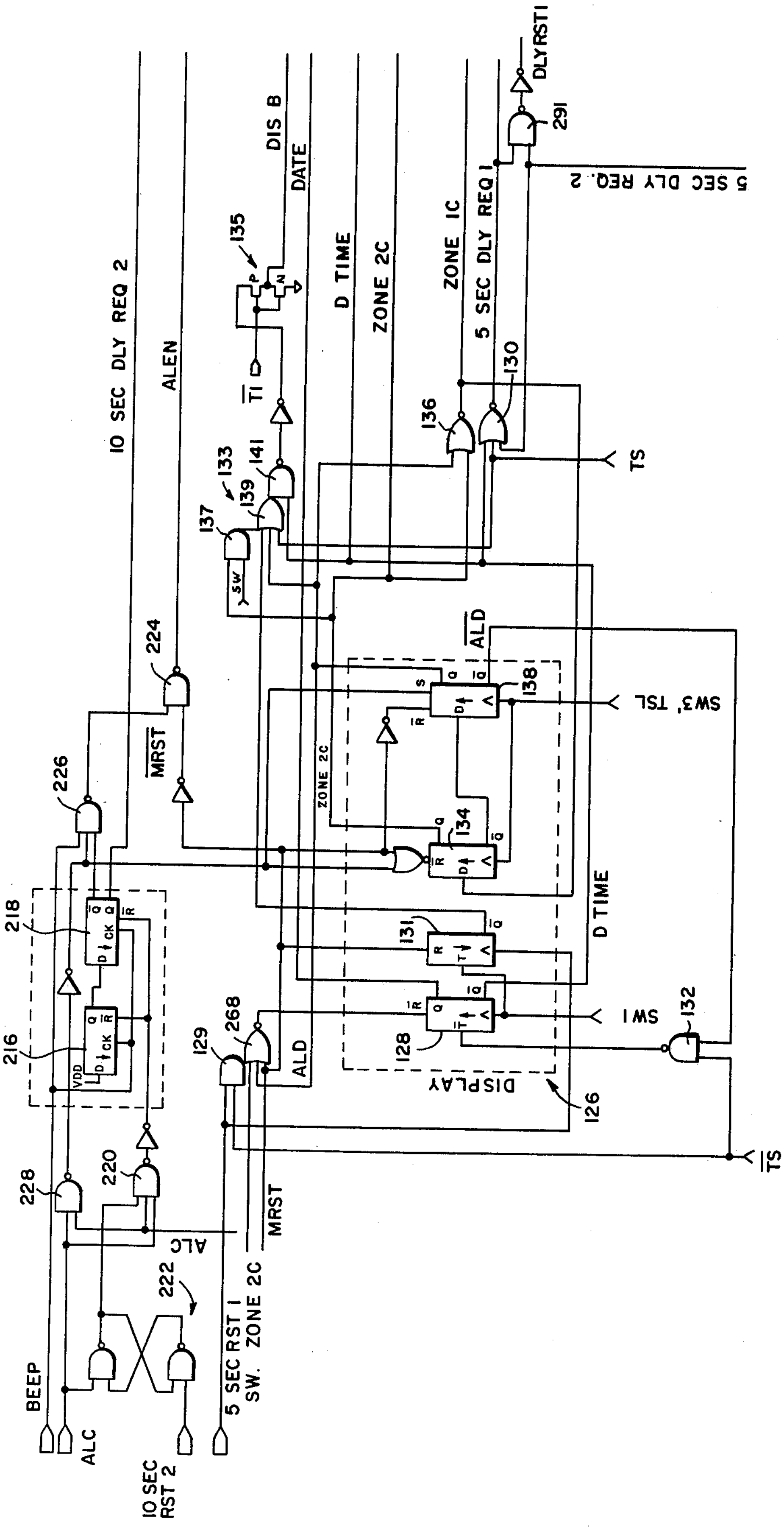
Figure 6:
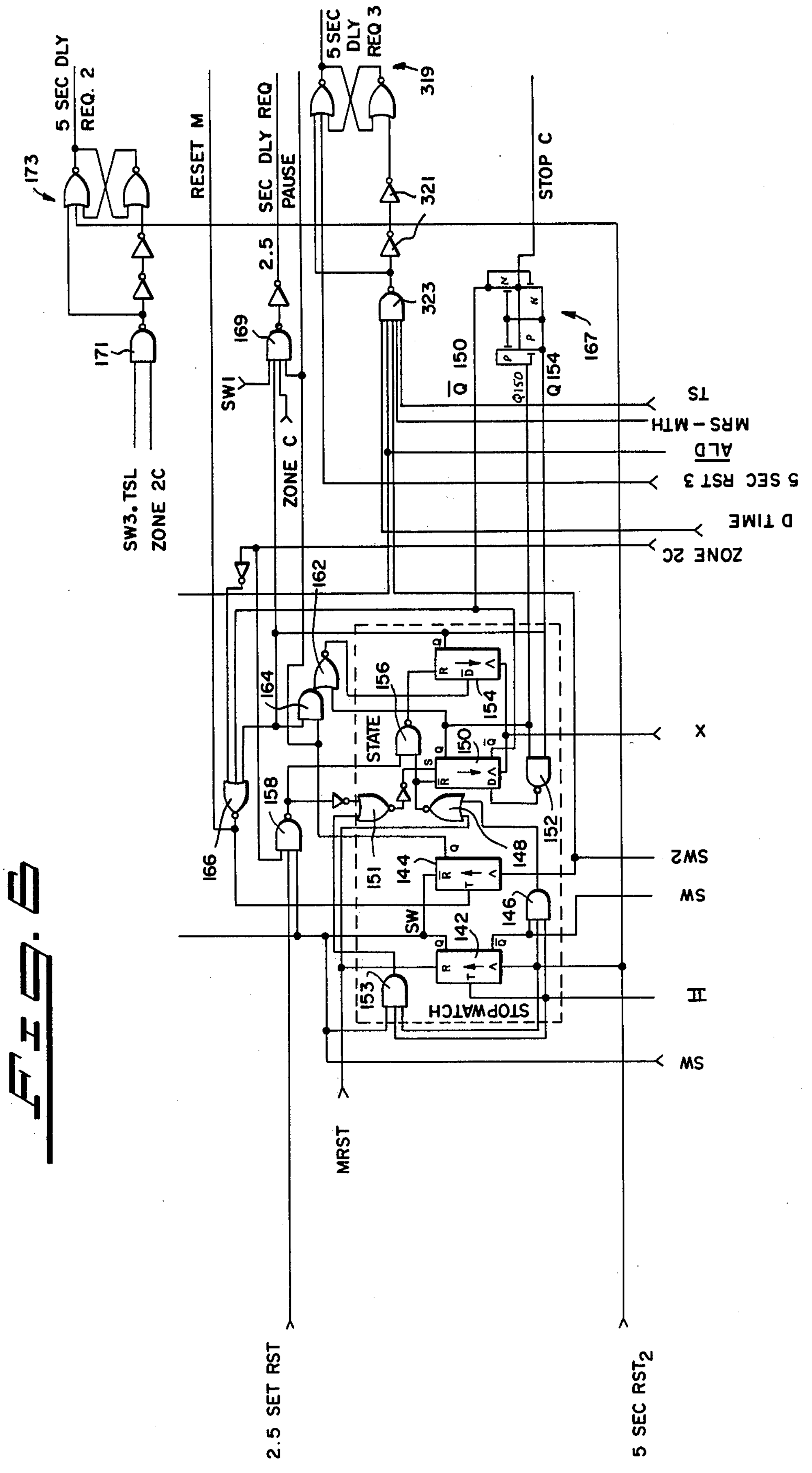
Figure 7:
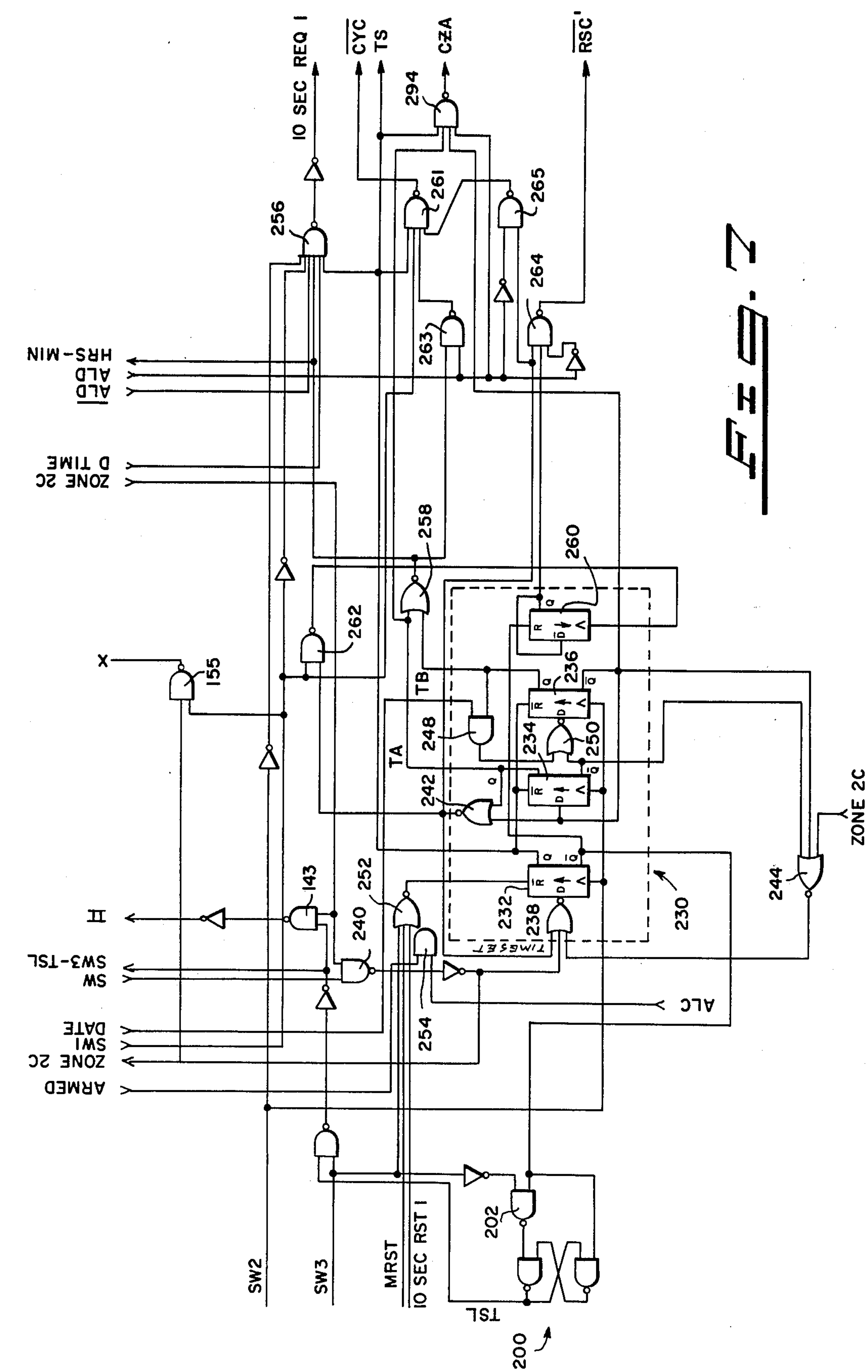
Figure 8:
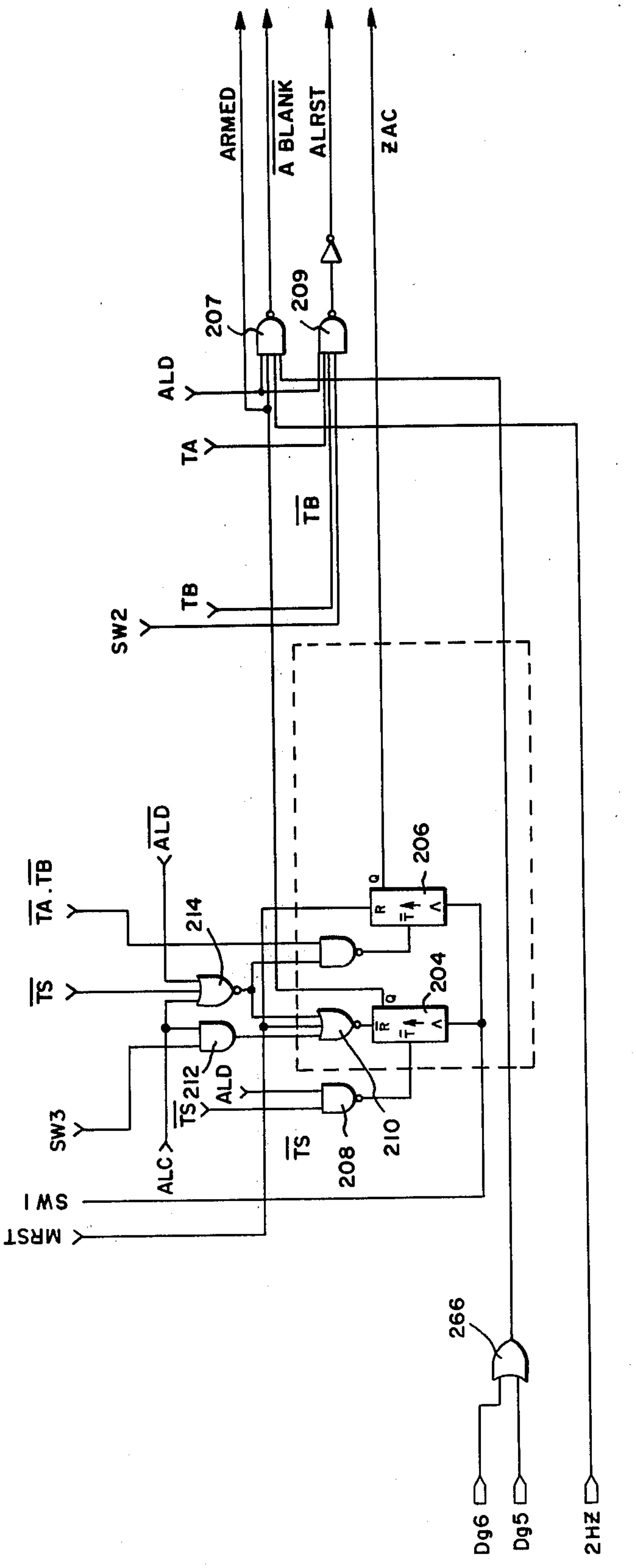
Figure 10:
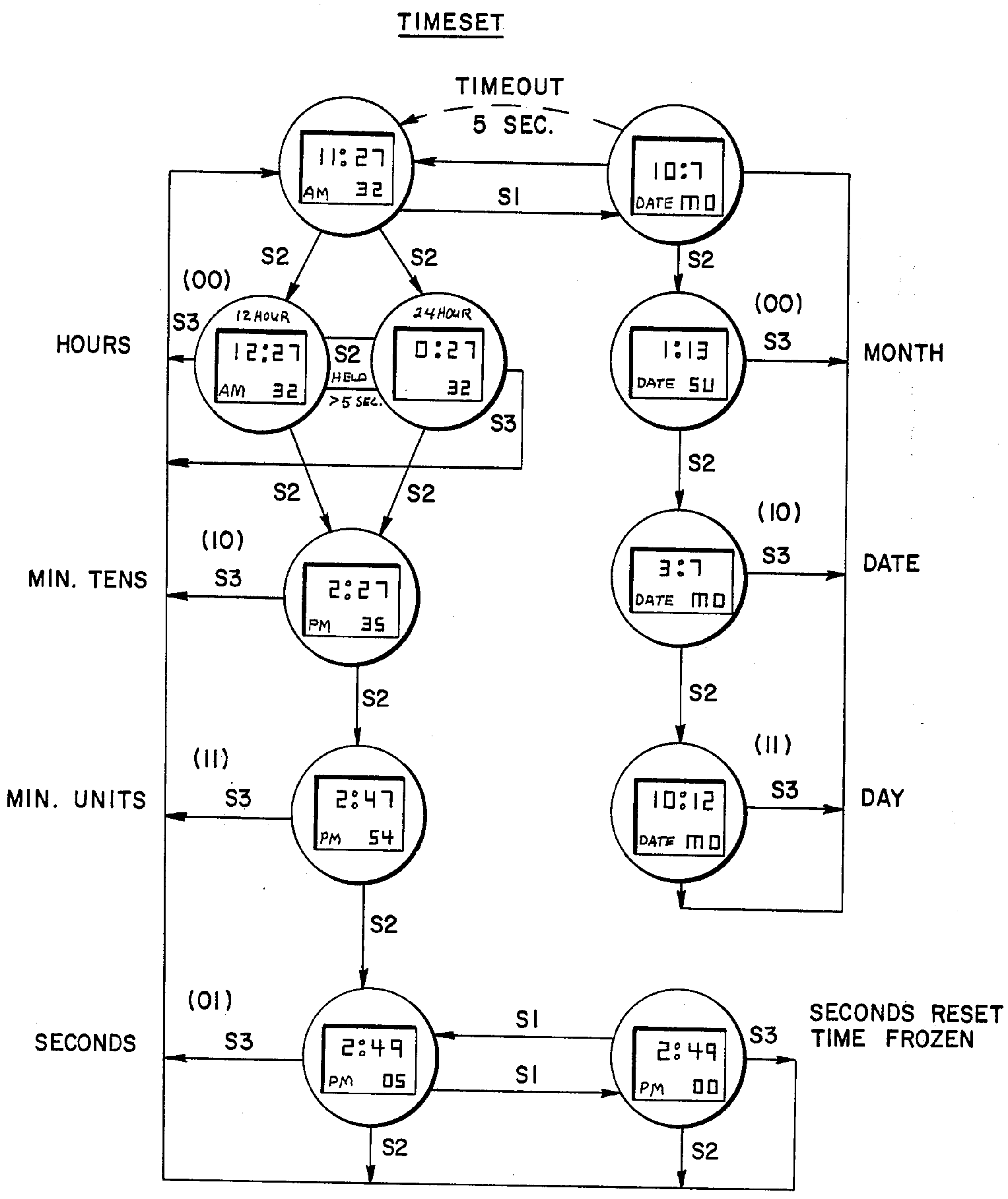
Figure 11:
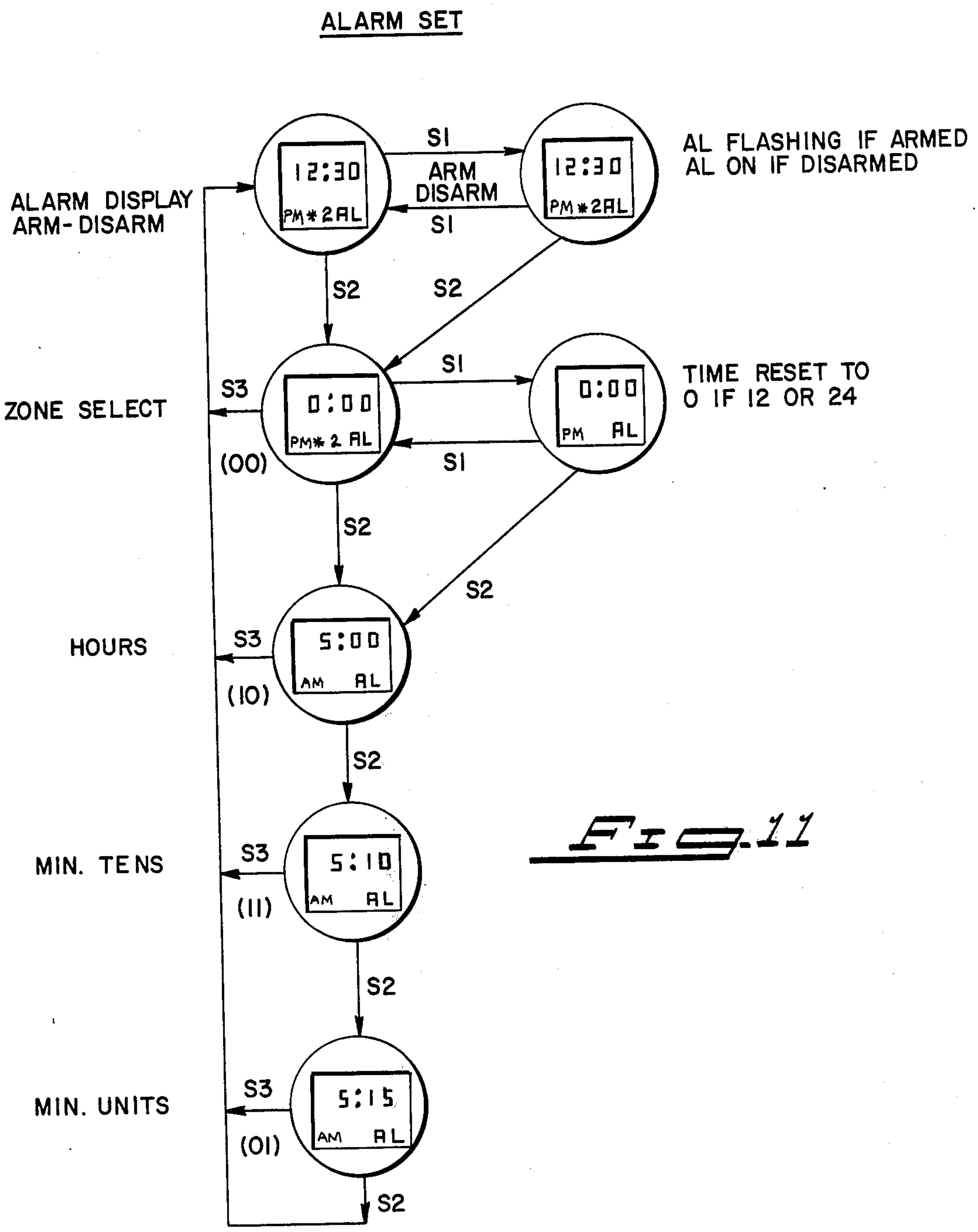
Figure 12:
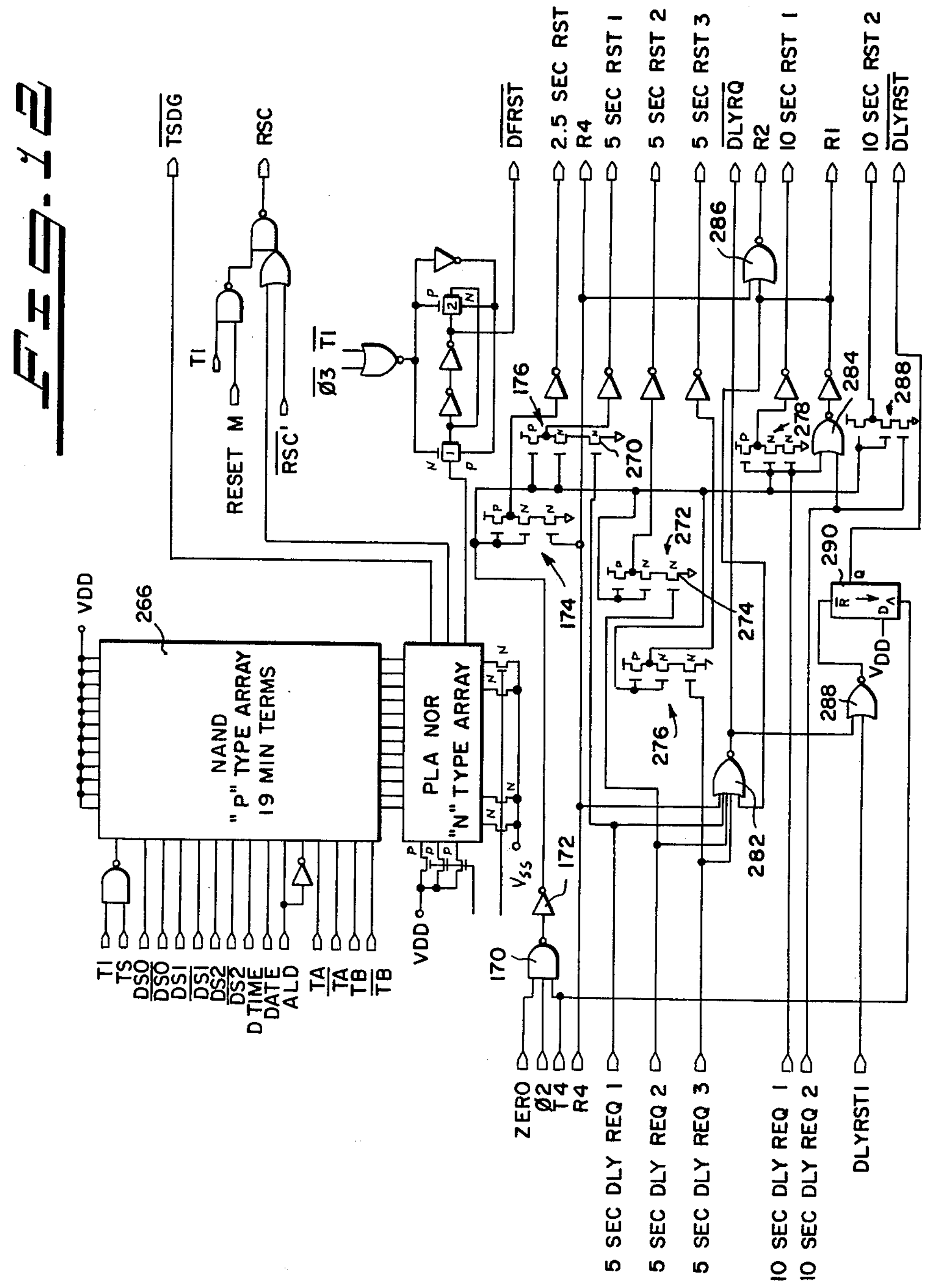
Figure 13:
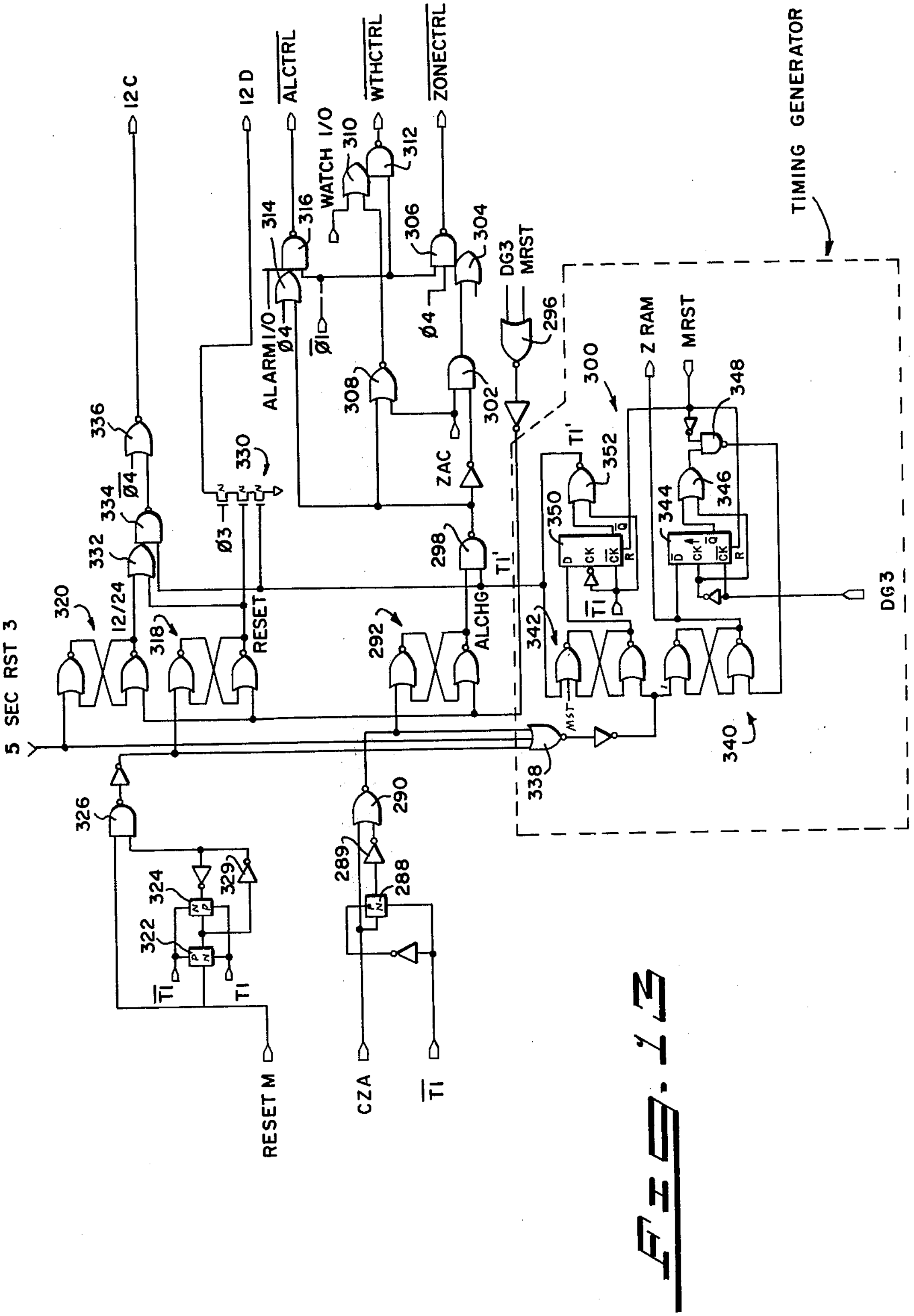
Figure 14:
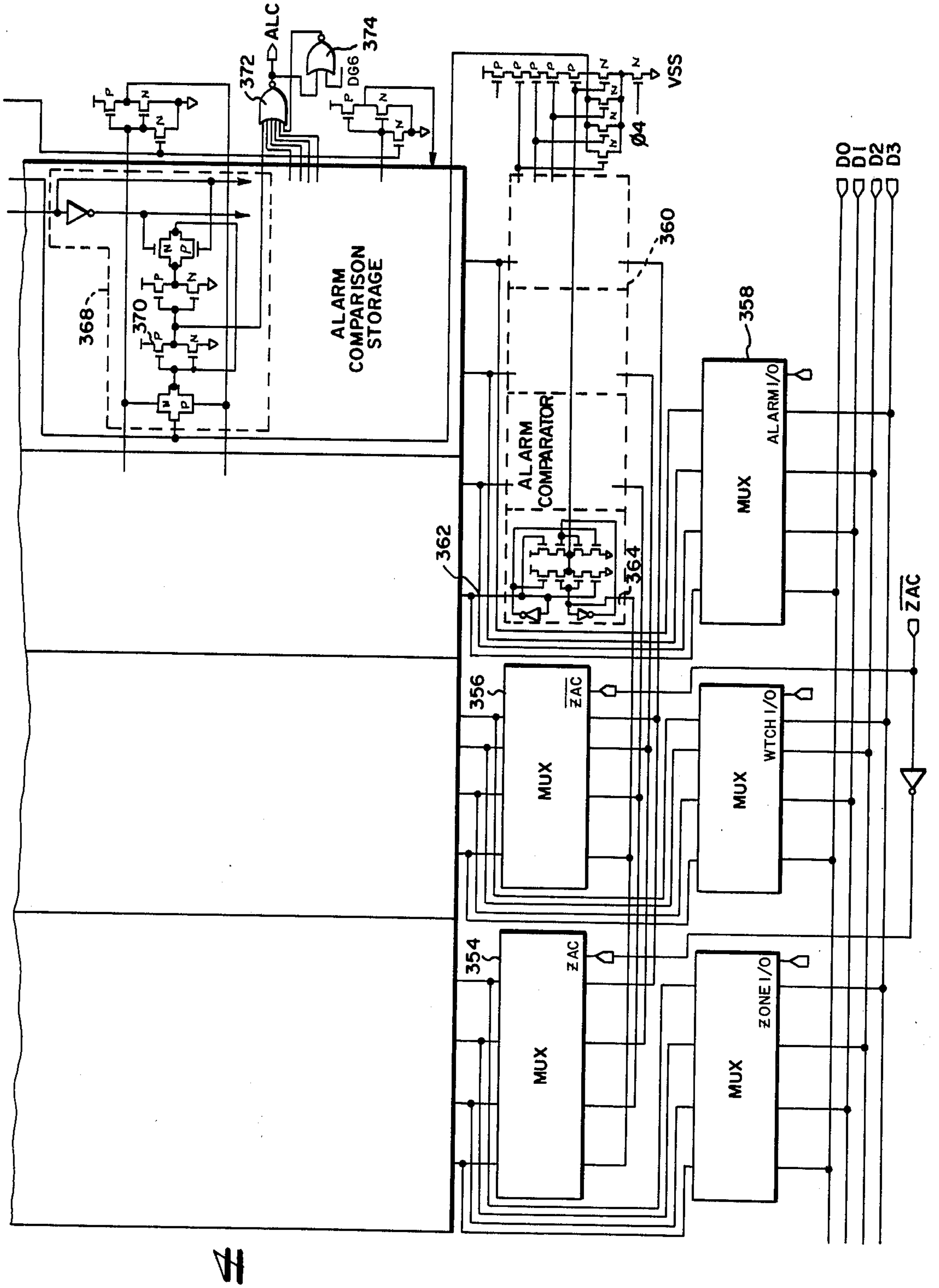

FIG. 4 is a flow diagram showing the normal display mode and stopwatch mode in an integrated circuit watch which incorporates the present invention;

FIG. 5 is a schematic diagram of a display state counter included within a control means of the present invention together with supplemental circuitry;

FIG. 6 is a schematic diagram of a stopwatch state counter in an integrated circuit watch incorporating the present invention;

FIG. 7 is a timeset state counter in an integrated circuit watch incorporating the present invention;

FIG. 8 is a schematic diagram of supplemental circuitry employed to implement an alarm mode in the illustrated integrated circuit watch;

FIG. 9 is a schematic diagram of an alarm driver wherein a piezoelectric transducer is driven by direct coupling to a low voltage signal without the use of high inductance or capacitive elements;

FIG. 10 is a timeset flow diagram showing a typical manner in which the watch zones of the present invention may be manipulated and time set;

FIG. 11 is a flow diagram showing one manner in which the alarm may be timeset in an integrated circuit watch incorporating the present invention;

FIG. 12 is a schematic diagram showing a time delay means which receives a plurality of time delay request signals and generates therefrom a corresponding plurality of time delay reset signals;

FIG. 13 is a schematic diagram of timing and address generators which generates certain address and instruction signals which are coupled to the flag processor and RAM in response to signals received from the time delay means and control means; and FIG. 14 is a schematic diagram showing portions of the RAM and supportive circuitry by which an alarm event is detected and alarm enable signal generated.

DETAILED DESCRIPTION OF THE PREFERRED EMBODIMENTS

The present invention is a digital watch circuit fabricated in an integrated circuit chip in a manner which is an improvement over the circuitry shown and described in connection with U.S. Pat. No. 4,063,409 issued Dec. 20, 1977 to Bayliss, which is incorporated herein by reference and which is assigned to the same assignee of the present invention (hereinafter referred to as the Custom Watch). As described therein, the timekeeping operation was effected by a combination of a PLA and main RAM. The PLA had several control inputs which were hardwired or fixed for selected applications. In the present invention the RAM and PLA combination is used for timekeeping in two independent time zones, a stopwatch and a multiple zone alarm. In order to use the same PLA and RAM combination for the multiple zone the control inputs to the PLA are time-shared, at least in part in response to a user program. A plurality of sets of the control inputs or flag bits to the PLA are stored in a separate flag RAM which is accessed by an address generator within a control means. Modification of the flag bits stored in the flag RAM is also possible by the use of a dedicated processor which is provided with a limited number of basic instructions. As a result, complex control and timing functions can be incorporated into a Custom Watch with a large degree of flexibility, simplicity of control, and with a minimum usage of chip space.

The specific embodiment described is a relative simplified example of the type of watches which can be fabricated according to the present invention. Thus, it must be understood that the described embodiment is only for the purposes of illustrating the powerful capabilities and potential of the present invention which could include, for example, watches having ten or more independent timekeeping zones or watches which could be accessed, manipulated and constituted by a user's program.

SYSTEM ARCHITECTURE

Figure 1:
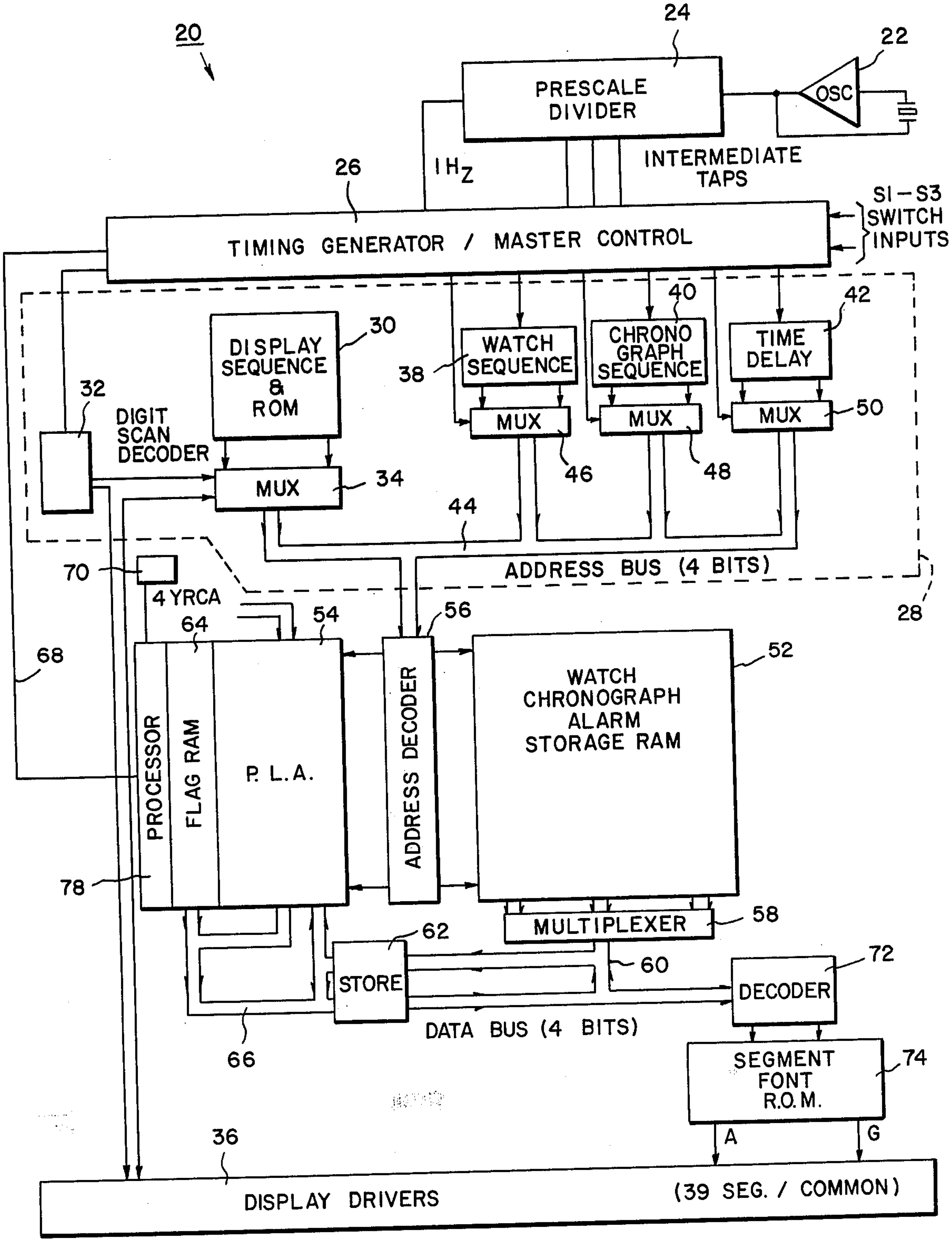
FIG. 1 is a block diagram of a complete integrated circuit watch incorporating the present invention.

The present invention is employed in an integrated circuit watch having the same general overall operation and organization as that previously described with respect to the "Custom Watch". The architecture of the Custom Watch which the present invention utilizes will be thus briefly described by way of background only. Referring to FIG. 1, watch 20 is based upon a crystal controlled oscillator 22 which has an output coupled to a prescale divider circuit 24. Prescale divider circuit 24 divides the frequency of oscillator 22, which in the present embodiment is 32,768 hertz, into a multiple of subfrequencies, such as 16, 8, 4 and 2 kilohertz, 256, 128, 32, 8, 2 and 1 hertz. These subfrequencies are used in a $\phi$ and T generator in substantially the same manner as described in the Custom Watch. Namely, the T generator generates clock signals T1–T4, and the $\phi$ generator generates clock signals $\phi$1–$\phi$4, D$\phi$3 and D$\phi$4, which are $\phi$ clocks generated during each of the T clock signals. T1 is used in time display and timeset modes, T2 and T3 are used to increment both the time zone watches and T4 is used to time delay intervals. $\phi$1 is a general precharge clock; $\phi$2 is used to decode addresses; D$\phi$3 allows complete logical implementation through the PLAs and allows the RAM to be read; and D$\phi$4 is generally used to permit writing operations. $\phi$3 and $\phi$4 are equivalent to the D$\phi$3 and D$\phi$4 clocks except, that D$\phi$3 and D$\phi$4 are selectively inhibited during display only modes. The $\phi$ and T generators are included as part of the timing generator and master control circuit 26.

That portion of circuit 26 denoted as the master control ciruitry has three mechanical momentary contact switches, S1-S3 provided for user input. While the timing generator portion of circuit 26 is substantially the same as in the Custom Watch, the master control circuit employed in the present invention is significantly different and will be described in greater detail below where it differs from the Custom Watch.

Timing and control circuit 26 is coupled to a RAM address generator 28 which is substantially similar to that previously described in regard to the Custom Watch. In particular, RAM address generator 28 includes a display sequence programmable read only memory (ROM) 30. Display sequence ROM 30 generates the binary addresses of various words retained within a main storage random access memory (RAM) 52. The RAM addresses are read from ROM 30 according to instructions received from timing and control circuit 26 through a plurality of digit scan decoders 32 substantially similar to that shown in regard to the Custom Watch. However, display sequence ROM 30 may be substantially smaller than that previously used with the Custom Watch and may be directly controlled by a fewer number of state and timing control signals. The output of digit scan decoder 32 is coupled to display sequence ROM 30 and multiplexer 34. The output of digit scan decoder 32 is also coupled to display drivers 36 in substantially the same manner as in the Custom Watch. Thus, the display of the output digits is synchronized with the generation of RAM addresses.

RAM address generator 28 may also include one or more sequencing circuits. For example, FIG. 1 shows a watch sequence circuit 38, a chronograph sequence circuit 40 and a time delay sequence circuit 42, each of which are substantially identical to that described in the Custom Watch. Each of the sequence circuits 38, 40 and 42 are coupled to and controlled by timing and control circuit 26 as in the Custom Watch and each appropriately generates additional addresses which are required for selected timekeeping or nondisplay operational modes of the watch. Each sequencing circuit is coupled to a single address bus 44 through corresponding multiplexing circuits 46, 48 and 50 controlled by timing and control circuit 26 as in the Custom Watch.

The incrementing and storage functions are performed in the main RAM 52 and in PLA 54. Address decoder 56 is coupled both to PLA 54 and RAM 52. The timekeeping operation is executed in RAM 52 and PLA 54 is substantially the same manner as in the Custom Watch. Namely, one or more predetermined control signals will be generated by timing and control circuit 26 depending upon the inputs through switches S1–S3. RAM address generator 28 will produce an appropriate RAM address in response to timing and control signals from timing and control circuit 26. For example, in the normal time incrementing operation of the watch, an initial RAM address will be accessed. The contents of the first address of the watch storage is then coupled by multiplexer 58 onto a common data bus 60. The data contents will be stored in a storage means 62. On the $\phi 3$ clock the contents of storage means 62 will be read into PLA 54 and compared to a preselected limit value. The appropriate limit value is selected in PLA 54 in response to PLA inputs from address decoder 56 and from flag RAM 64 of the present invention. RAM 64 in turn is coupled to the control means, timing and control circuit 26, in a manner described in greater detail below. If the contents of the word read from storage means 62 is less than the corresponding selected limit value, the data word will be incremented by one and fed back by a feedback data bus 66 through RAM read/write buffer or storage means 62 and coupled to data bus 60. The incremented count will be fed back from data bus 60 at the appropriate time into the initial location in the watch storage portion of RAM 52.

Assume, the initial location within the watch storage has a predetermined limit value of 9. When the contents of the initial location reach 9, PLA 54 will generate an increment or carry flag which is fed back into timing and control circuits 26 by feedback line 68. The contents of the initial location of the watch storage is reset to zero and on the next corresponding T clock the next higher location of the watch storage, addressed by the appropriate sequence generator in RAM address generator 28, is incremented by 1 and the result stored back into RAM 52. In this manner, a cumulative count is maintained for seconds, minutes, hours, a.m. or p.m., day of the week, months and year with appropriate carries. Calendar corrections are provided by a circuit means 70 described in greater detail below.

According to which switch inputs, S1–S3, are selected, timing and control circuit 26 will generate various other control signals in response to the switch commands which will selectively activate display sequence ROM 30 and the various address sequence circuits of RAM address generator 28. During the display modes, the data from RAM 52 and PLA 54 will be selectively coupled to decoder 72 which is substantially the same as in the Custom Watch. Again, according to the switch inputs and control signals generated by timing control circuit 26 one of a plurality of font segments may be chosen from font segment ROM 74. ROM 74 will sequentially activate selected alphanumeric characters associated with display driver 36 similar to the Custom Watch.

In light of the foregoing background consider now timing control circuit 26 of the present invention together with flag RAM 64, processor 78 and such other circuit elements made and used according to the present invention.

THE FLAG RAM AND PROCESSOR

User programmability is provided by switches S1–S3 both by the duration and sequence in which selected switches are held closed. In the illustrated embodiment the switch activation is a single switch closure but could also include switch openings and multiple switch activations either in sequence or simultaneously. Switches S1–S3 are provided with appropriate debounce circuitry and buffer circuitry substantially identical to that disclosed with respect to the Custom Watch. This circuitry will produce the internal control signals SW1, SW2 and SW3 which are active high corresponding to S1, S2 and S3 closures respectively.

One of the features of the present invention includes a user ability to program the watch into certain configurations rather than to merely select configurations in a predetermined sequence. Although it may be possible to provide for user programmability by a series of flip-flops which are multiplexed into the control inputs to PLA 54 through which the timekeeping configuration of the watch is determined, the present invention provides a means for user programmability which is simpler, less space intensive and significantly more flexible. When a dedicated processor is used to execute a plurality of specialized watch functions, the data can be processed by a PLA with a great savings in chip area and efficiency compared to that described in regard to the Custom Watch. The PLA serves as a hardwired set of processing instructions by which the data is manipulated, or, equivalently, by which time is kept. In the Custom Watch, PLA 54 had several control inputs which, were fixed so that the microprocessor was configured in an unalterable, sequence of watch configurations. The processing instructions wired into PLA 54 can be altered by selectively coupling flag bits from a flag RAM 64 into PLA 54 as PLA flag inputs and further manipulating the flag bits in RAM 64 by means of a processor 78.

The present invention provides a means by which the PLA can be programmed by appropriately programming the control inputs. The inputs to PLA 54 are best shown in FIGS. *2a* and *2b* as K1, K2, K3, C1, C2, and 12 and their respective logical complements. These PLA inputs are substantially identical to those described in connection with the Custom Watch. In particular, K1 and its complement indicate to PLA 54, when counting hours, whether or not the hours tens units is to count from 2 to 3 or 2 to 1 and 3 to 4 or 3 to 0 depending on whether or not the watch is programmed in the 12 or 24 hour time keeping mode and if the time is past 10:00 or 20:00. Similarly, the K2 flag controls the data count. After the date tens digit is incremented from 1 to 2, a flag bit will be set on the 24th day of the month to call for a decision on whether or not the month is to be a 28, 29, 30 or 31 day month. Any date between the 22nd to 27th day of the month could have been selected and the data of the 24th is chosen only a matter of convenience. The C1 and C2 flags are used as a coded input to indicate whether the month in question is in fact a 28, 29, 30 or 31 day month. The K3 flag controls the months unit count from 2 to 3 or 2 to 1. In other words, during the first 9 months of the first year when the month tens digit is 0, the K3 flag will be set so that the months units digit will roll over from 2 to 3 between February and March. However, when the month tens digit is set beginning in October, the K3 flag will be reset so that the month units digit will roll over from 2 to 1 between December and January as the month tens digit is reset.

The flag bits for the control inputs to PLA 54 are stored in a flag RAM 64 illustrated in FIGS. *2a* and *2b*. RAM 64 has substantially same timing sequence as main storage RAM 52 and operates synchronously therewith based upon the same T and $\phi$ timing signals. RAM 64 is accessed at the appropriate times by address generators described in greater detail below. RAM 64, in the embodiment illustrated, is comprised of memory cells logically arranged in three rows and eight columns. Eight cells of the two rows are assigned to each of the two watch zones and two cells of the third row to an alarm function. The remaining cell space is unused. The rows are accessed by the address signals watch control, WTCHCTRL; alarm control, ALCTRL; and zone control, ZONE CTRL. The first zone watch is referred to as the "watch" or zone I, while the second zone watch will be referred to as the "zone" or "zone II." The eight columns are accessed by a processor 78, which in the presently preferred embodiment is a primitive processor made up of tristated inverters having as their inputs various timing signals such as $\phi 2$ and $\phi 4$, various PLA output signals such as AK1, AK2, AK3 and AK4 and various control signals such as 12C, 12D, and MNTHU.

Processor 78 is provided with five processor instructions, namely: force to zero, force to one complement data, enter data, and do nothing. A memory to memory transfer is included as a pseudo-instruction which is executed by the address generator. The object is to manipulate data within RAM 64 and appropriately couple the processed data into the K1, K2, K3, C1, C2 and 12 PLA inputs to provide the appropriate flag settings by which PLA 54 will manipulate data within main storage RAM 52. By this means it may be appreciated that, although only two watches are shown as being used in the present invention, with little additional requirement for chip space and practically no additional design complication, a watch organized according to the present invention could easily include, ten, twenty or even thirty separate types of watches and stopwatches. In addition, each of these watches could be separately accessed through a user's program. The ease by which the number of storage cells could be expanded to include scores of watch functions without corresponding circuit complexity or use of additional chip space, illustrates the power and capacity of a PLA/-RAM watch when organized according to the present invention.

Processor 78 is comprised of a plurality of tristated inverters whose operation illustrates the five possible instructions provided in the presently illustrated embodiment. Consider for example inverter 80 in FIG. *2a*. A transfer gate 82 is coupled between input 84 and output 86. Output 86 of tristate inverter 80 is coupled to a data bus line 88. Data bus line 88 is charged during the $\phi$ 1 clock through a P-type precharge device 90. Transfer gate 82 is enabled during each clock $\phi$ 2. Similarly, during $\phi$ 2, RAM 64 may be accessed such that one of the rows of cells addressed by the watch control, alarm control or zone control signals is selectively coupled to data bus 88. The contents of the RAM cell which was accessed is then coupled to output 86 of inverter 80. If the output from PLA 54, AK1 is true, indicating that the count of hours is less than 10 then tristate inverter 80 will remain tristated or floated since it will be uncoupled from ground by the application of the signal $\overline{AK1}$ to a N-type device coupling output 86 to ground and the application of AK1 to a P-type device coupling output 86 to VDD. This is the do-nothing instruction and will cause the output of the corresponding RAM cell coupled to data bus 88 to be rewritten into the addressed RAM cell during $\phi$ 4.

However, if the PLA output AK1 is false, inverter 80 will not be tristated during $\phi$ 4. Data written onto output 86 will be coupled through transfer gate 82 on clock $\phi$ 2 to be stored in the residual capacitance upon the CMOS gate 82. Therefore, when subsequently enabled during $\phi$ 4, the inverse data will be rewritten upon node 86 and into the appropriately coupled RAM cell. This constitutes the complement data instruction.

Activation of the master reset cycle signal, $\overline{MR}$, through NOR gate 96 during clock $\phi$ 4 decouples inverter 80 from the VDD and pulls output 86 to ground through an N-type device and as a result a zero will be entered into the appropriate RAM cell. This constitutes the third type instruction, force-to-zero.

When the signal 12C is low, a P-type device will couple VDD to output 86 in FIG. *2a* and disconnect output 86 from ground even when inverter 80 is enabled by turning off one of the N-type devices in the inverter chain. As a result a 1 will be entered into the appropriate RAM cell. This constitutes the force-to-one instruction.

The memory-to-memory pseudoinstruction is not a manipulation effected through the tristate inverters, which remain tristated as in the do-nothing instruction, but is executed by accessing a first row of RAM cells onto the respective busses during the read clock $\phi$ 3 and writing simultaneously into two rows of RAM cells during the write clock $\phi$ 4 by causing two address to go high simultaneously. This memory-to-memory transfer in RAM 76 is used during the alarm mode as described below. Bus line 88 is coupled to the K1 input to PLA 54. Therefore, the force-to-zero instruction, $\overline{MR}$, will be used to initialize operation; the complement instruction, AK1, used to set or reset the K1 flag; the do-nothing instruction, $\overline{AK1}$, used to permit normal counting; and force-to-one instruction to reset the K1 flag after a 12 to 24 hour conversion or a stopwatch reset operation.

Examination of each of the other inverters will also indicate that each operates in a similar manner to execute one or more of the five possible processor instructions. For example, inverter 98, corresponding to flag K4, is tristated by the output of NOR gate 100 having $\overline{AK4 \cdot \phi\ 4}$ as its output for the do-nothing instruction. Transfer gate 102 provides for the complement data instruction, while $\overline{MR\ \phi\ 4}$ is used for the force-to-one instruction.

The output of inverter 98 is coupled to bus line 99 and is used as the input to inverter 104, corresponding to flag K2, to effect the enter data instruction. Inverter 104 is tristated by the output of NOR gate 106, namely $\overline{AK2}$ $\phi$ 4 providing for the enter data instruction. Inverter 104 has no transfer gate and is unable to complement data. Appropriate coupling to gate 96 provides for the force-to-zero instruction in inverter 104 in response to MR $\phi$ 4.

Figure 2A:
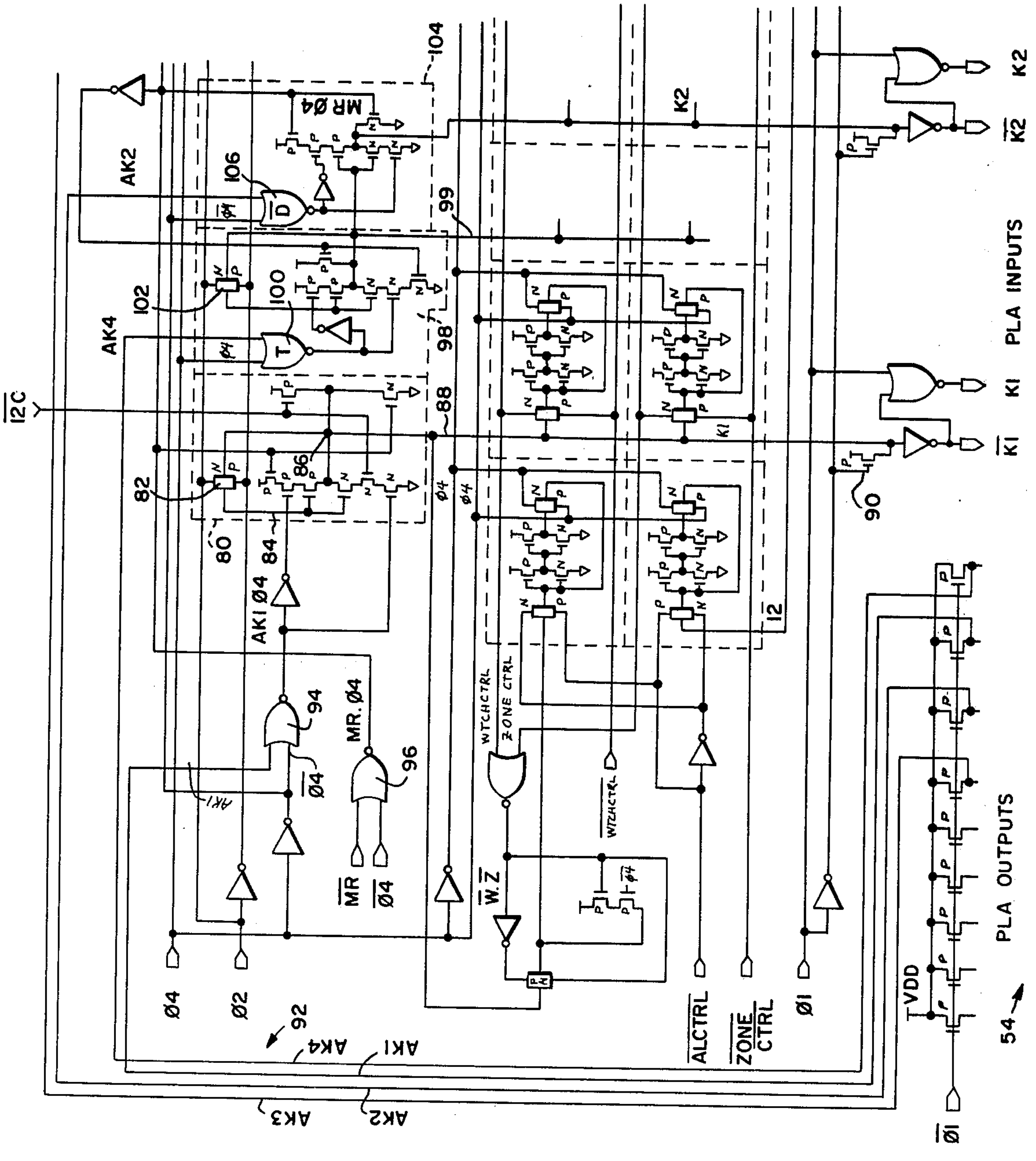
Figure 2B:
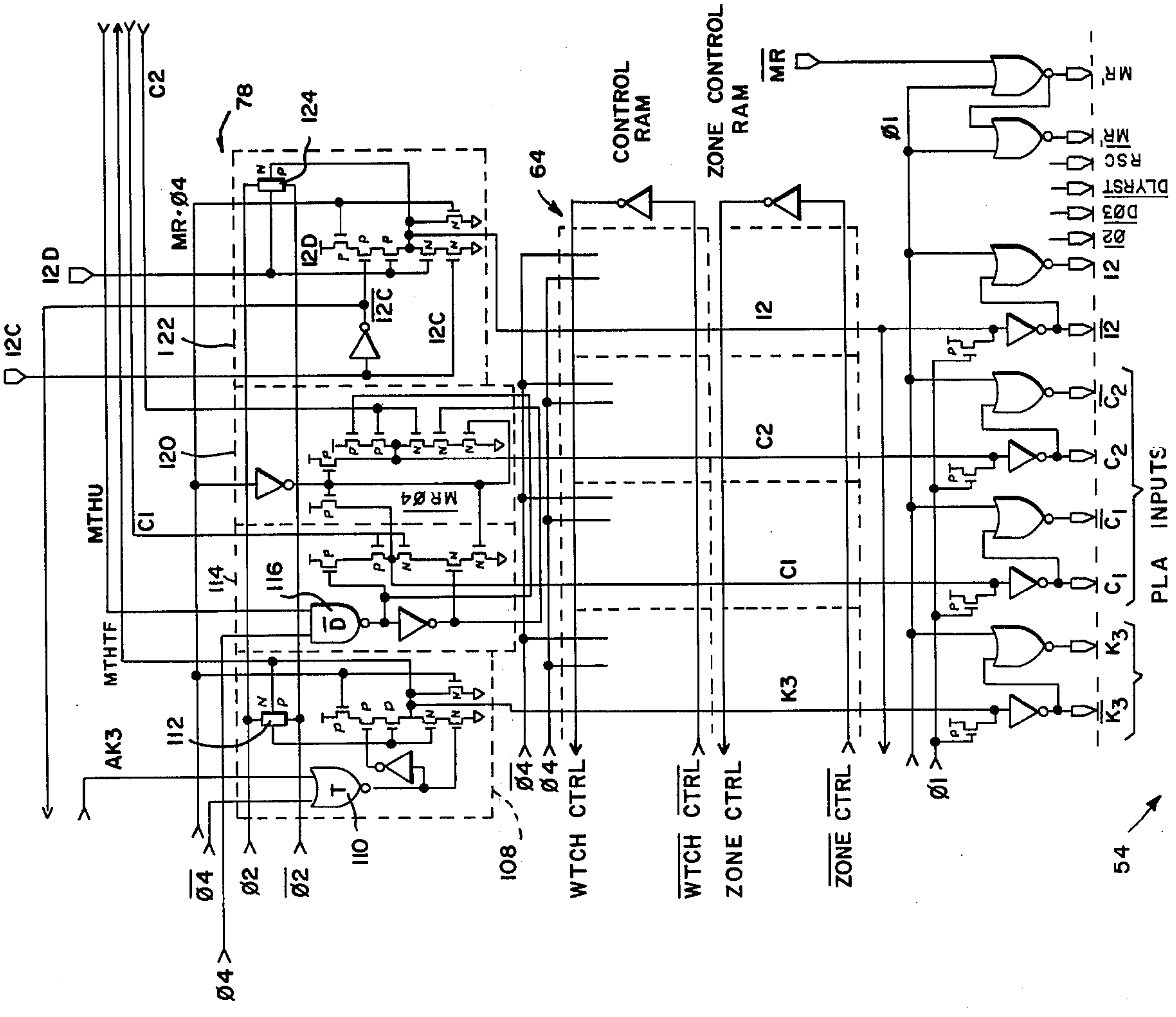

Similarly, as shown in FIG. 2*b*, inverter 108, corresponding to flag K3, is tristated by the output of gate 110 having as its output $\overline{AK3}$ $\phi$ 4, provides the complement data instruction by transfer gate 112, and provides a force-to-zero instruction by appropriate coupling to gate 96. The output of inverter 108 is the internal control signal months tens flag, MTHTF, which provides one input to circuit means 70.

Inverter 114 is tristated by the output of gate 116, which is the NAND function of months unit, MTHU, derived from decoder 56 and $\phi$ 4. The enter data instruction input to inverter 114 is C1 derived from calendar circuit 70 described below in connection with FIG. 3. No transfer gate is provided. The enter data instruction is executed by appropriate coupling to gate 116. The force-to-one instruction is provided by appropriate coupling to gate 96 in response to MR $\phi$ 4.

Similarly, inverter 120 is tristated by the output of gate 116 and includes a force-to-one instruction based on the function MR $\phi$ 4 from gate 96. The enter data input invention to inverter 120 is the internal control signal C2, derived from circuit 70, which together with C1 provide a binary code whereby the number of days within any given month can be indicated. No transfer gate is provided or means for executing the force-to-zero instruction.

Finally, inverter circuit 122 is tristated by internal control signal 12C, is forced to zero by MR·$\phi$ 4, has its input coupled to data signal 12D to effect the enter data instruction, and has a transfer gate 124 to selectively couple the output and input as described above.

The operation of processor 78 in connection with RAM 64 can better be understood if a typical counting sequence is considered. The watch of the present invention is capable of operating either in a 12 hour mode. In other words, the watch will count from 1 o'clock to 12 o'clock with an A.M. indicator and then will reset to 1 o'clock and count again to 12 o'clock with a P.M. indicator. Alternatively, the watch will count from 0000 hours to 2400 hours. Hours units and hours tens are coded separately in binary coded decimal form. Thus, in the 12 hour mode, hours units will cycle from 1 through 9, reset to 0 and then increment to 2 to be reset again at 1. Therefore, when the hours unit storage word is incremented and reaches the point where the contents has the value of 9 and then rolls over to 0 with a carry to the hours ten storage cell, the PLA output AK1 will go active, that is will assume a low logical value, to enable inverter 80. On the $\phi$ 2 clock the contents of the accessed storage cell within RAM 76 is then complemented through transfer gate 82 and stored on $\phi$ 4. As a result, the K1 flag will be toggled. Thus, when the hours unit storage word has a contents which next reaches 2, the storage word is not incremented to the value 3 but is reset to the value 1 according to the flag. AK1 will again go active causing the contents of the selected storage cell in control RAM 76 to be retoggled to its initial value to allow the contents of the hours unit storage word to be incremented as before. The contents of the selected cell can be reset by being appropriately forced to zero by the clock signal, MR $\phi$ 4, or set to a 1 by processor instruction signal 12C.

Similarly, the flags K4 and K2 regulate the counting of the days of the month. During each month the days will count from 1 to some number equal to or in excess of 28. Therefore, days units will be cycled from 1 to 9 during the first nine days of the months, from 0 to 9 during the next ten days of the month and at least from 0 to 8 during the third set of nine days in the month. During this last interval, days units on either an 8, 9, 0 or 1 will be reset to 1. When the days tens storage word increments from 1 to 2 on the 20th day of the month, AK4 goes active to enable inverter 98 in FIG. 2*a*. During $\phi$ 2 the contents of the addressed storage cell coupled to inverter 98 will be complemented through transfer gate 102. This toggled value for K4 is stored in the addressed storage cell coupled to bus line 99 and then provided as the input to inverter 104. When months unit is incremented to the value 4, on the 24th of the month, the PLA output AK2 goes active and the toggled value for K4 is coupled to the selected storage cell for the flag K2. Only the flag K2 is provided as an input to the main PLA. The K2 flag is then used as a PLA input to precondition the PLA logic to sense the C1 and C2 inputs which will designate if the month in question is a 28, 29, 30 or 31 day month in a manner described below. Inverters 98 and 104 both have means for initializing their values by use of the clock signal, MR $\phi$ 4.

CALENDAR CORRECTION CIRCUIT

C1 and C2 are generated by a calendar correction circuit 70 shown in FIG. 3. Each of the months of the year are associated with a code number between 1 and 12 with January being mapped to 1 and December mapped to 12. The watch of the present invention counts through a 4 year cycle. In other words, after reaching 12, the month count is reset to 21. During the second year, the month count progresses from 21 through 32. Similarly, the third year's count begins at 41 and ends at 52 and in the fourth year begins at 61 and ends at 72 then to be reset to 1 to cycle through another four year period. The months of April, June, September and November each have 30 days. The remaining months have 31 days with the exception of February.

The output from main RAM 52, M3–M0, are coupled to a plurality of random logic gates. Namely, M1 and M2 are the inputs to an exclusive OR gate 178 while $\overline{M3}$ and M0 together with the output of gate 178 are the inputs to AND gate 180. $\overline{M2}$, $\overline{M1}$ and $\overline{M0}$ are the inputs to AND gate 182 whose output in turn is coupled to NOR gate 184. The other inputs to NOR gate 184 are the output from gate 180 and the output of NOR gate 186 which represents the logical product, FEB·$\overline{LPYR}$ which is true only when the month of February is reached during a nonleap year. The output of gate 184 is C1. It can easily be verified that when M3–M0 and the complements represent the BCD months unit count, the output of gate 184, C1, will be true when the month units is a 3, 5, 8 or 0. These are in fact the code numbers for the month units corresponding to March, May, August, and October. MNTHU, which is the decoded address signal for the months unit RAM cell, is addressed and active only when the month is being changed. Therefore, when March (0011) is being read from RAM 52 and coupled to PLA 54, it is decoded in circuit 70 to produce the (C1, C2) code for April. The April (C1, C2) code is stored and appropriately used later during the April counting.

A standard NOR gate decoder 188 having M0, M1, M2, M3 and MTHTF, the months tens flag, as inputs, will provide an active output whenver the month unit indicates a February. The months tens flag is derived from the output inverter 108 which indicates that October, November or December, which are the only months having a month tens unit, is the month represented in the month tens storage. In this way the months unit content for December is distinguished from that of February.

Latch 190 designates one of the four years which is counted as being a leap year. As previously stated, 48 months are counted during a single cycle beginning at the code numbers 1 through 72. If the code numbers for each month are represented in BCD form, the second and third most significant bits of the month tens digit will cycle through the states (00), (01), (10) and (11) for a 48 month cycle. Thus, M1 and M2, the output from main RAM 52, are provided as inputs to NAND gate 192. Similarly, the month tens address function, MTHT, from decoder 56 and the complement of the month tens flag are provided as inputs to NAND gate 192. The inputs to NAND gate 194 are the output from NAND gate 192 and the complement of MTHTF and the month tens address function, MTHT. The output of NAND gate 194 is coupled to the set terminal RS latch 196. The output of NAND gate 192 is similarly coupled to the input of the reset terminal of latch 196. The output of NAND gate 192 contains the factor M1.M2. The product of M1 and M2 will always be zero except during the fourth year, represented by the state (11), during which it is 1. Also included in the product of the output of NAND gate 192 is the logical product of MTHT and $\overline{\text{MTHTF}}$. This product will be true only when the months tens digit is being addressed other than between the tenth and eleventh month of the year. In other words, whenever the months tens digit is incremented between December of one year and January of the following year. Therefore, circuit 190 tests the logical product of M1 and M2 between the rollover of the watch circuit between December and January of each year. The input to the set terminal of latch 196 will thus always be 0 except during the fourth year, represented by the state (11), which will be designated as the leap year. The leap year signal is then coupled to NOR gate 186 to be factored in control signal C1 through gate 184. Thus, C1 during a nonleap year will be fixed to 0 during February. However, during a leap year, and during a February, the output of NOR gate 184, C1, will be true. Therefore, the code (C2, C1) for 28, 29, 30 and 31 day months is respectively (00), (01), (10) and (11). This C1 and C2 code is inverted through inverters 120 and 114, reinverted and inserted into PLA 54 and stored in respective selected storage cells in flag RAM 64 according to the processor instructions coupled to processor 78.

Finally, the 12C and 12D inputs or provided to inverter 122 in FIG. *2b* and similarly manipulated with respect to their flag RAM cells to indicate whether or not the watch is or is not in a 12 hour timekeeping mode.

The description and understanding of the present invention as well as its advantages are better understood if the various modes, configurations and states of operation in which the watch operates are described. The following modes are given for the purpose of illustration only and are not intended to limit the scope of the present invention. The watch of the illustrated embodiment operates in a normal display mode, a stopwatch mode, and a timeset mode each having one or more configurations capable of assuming one or more states.

Normal Display Mode

FIG. 4 illustrates the normal display mode of a watch organized according to the present invention wherein two independent time zone watches are included with an alarm.

The first watch, zone I, normally will display hours, minutes and seconds and optionally an a.m. or p.m. designator if user programmed in a twelve hour mode. Otherwise, the a.m. or p.m. designator will be omitted if the watch is user programmed in a 24 hour timekeeping mode. In the preferred embodiment, display is effected by a liquid crystal display (LCD), although appropriate circuitry for a light emitting diode (LED) display could also easily accomodated. Closure of switch, S1, will cause the month, date and day of the week to be displayed for the given zone, i.e., zone I or zone II. An automatic return or timeout occurs after 5 seconds unless a second S1 closure returns display to hours, minutes and seconds sooner.

A single closure of switch, S3, will cause the watch to switch from display of zone I to zone II. Zone II has the same alternating display on the closure of switch S1 as described above. An identifier is also activated to indicate automatic timeout when the watch is in the second zone. However, if S3 is held closed for more than 5 seconds when in the zone I display mode, the watch will switch to a stopwatch or chronograph mode as described and illustrated in greater detail in connection with FIG. 4 below. Alarm display is entered if S3 is closed while in the stopwatch mode or in the zone II display.

When in alarm display, the hours and minutes, at which the alarm is set, will be displayed with an appropriate alarm identifier and an a.m. or p.m. indicator when in a twelve hour timekeeping mode. The alarm indicator, AL, will flash if the alarm is armed and remain constant if the alarm is disarmed. Closure of switch, S1, will arm or disarm the alarm. A final closure of switch, S3, will return the normal display to the zone I watch.

The normal display state counter is illustrated in FIG. 5 together with its associated support circuitry, the stopwatch state counter is illustrated in FIG. 6 and the timeset state counter in FIG. 7. Referring to FIG. 5 the switch signal, SW1, is provided as a rising edge clock input to display state counter 126. In particular, to the first toggle flip-flop 128. Toggle flip-flop 128 and the other toggle flip-flops employed by the present invention are substantially similar to a D-type flip-flop with the modification that the Q output is combined in an exclusive OR function with the T input, the exclusive OR function being coupled to the D input in order to prevent spurious changes of state. As long as the T input is true, the toggle flip-flop will toggle on each clock, otherwise it remains unchanged.

FIG. 4 illustrates that during the normal display sequence, the display goes through three states, namely zone I, zone II or alarm display. Flip-flops 134 and 138 of FIG. 5 provide the three state counter for this display sequence by cycling through the states (00), (10) and (11) as defined by the Q outputs of flip-flops 134 and 138 respectively. D-type flip-flops 134 and 138 are clocked by the product SW3.TSL. TSL is the time-set latch signal generated by RS latch 200 shown in FIG. 7. The output of latch 200 is TSL. The input to latch 200 is the internal control signal timeset, TS, which will be described below and which is active when the watch is in timeset, that is, when the user is setting the watch to a selected value. $\overline{TS}$ is provided as the set input to latch 200 while the reset input is provided by the output of NAND gate 202. The inputs to NAND gate 202 are $\overline{SW3}$ and $\overline{TS}$. Therefore, latch 200 will be reset whenever when the watch is in timeset or switch S3 is closed and will be set whenever the watch is not in timeset. Timeset latch, TSL, is then used to block the state clocks when the watch is in timeset. This is necessary since, as will be shown, switch S3 is used in timeset to control the timeset sequence, during which time the state maintained by display counter 126 must not change.

The Q output of flip-flop 134 is the output signal ZONE 2C, which is later employed in conventional logic circuitry, not shown, to generate the zone I and zone II indicator signals to indicate which of the time zones the watch is displaying. The Q output of flip-flop 138, alarm display, ALD, is also coupled to NOR gate 136 to produce the signal ZONE 1C which in turn is coupled back to the D input of flip-flop 134 and which is also used to generate a zone indicator as ZONE $\overline{1C}$. The other input to NOR gate 136 is ZONE 2C. The $\overline{Q}$ output of flip-flop 134 is coupled to the $\overline{D}$ input of flip-flop 138. It can be easily verified from the circuit of FIG. 5 that the counter formed by flip-flops 138 and 134 together with gate 136, cycle through the states as defined by their Q outputs of (00), (01), (11) which are respectively the cyclic states for signals ALD and ZONE 2C. Thus, ALD is 0 in zone I and zone II displays while ZONE 2C denotes the zone II display, and ALD is 1 in alarm display.

Flip-flop 128 provides the internal control signals DATE at its Q output and DTIME at its $\overline{Q}$ output in order to alternate the normal display between an hours, minutes and seconds time display which is initiated by DTIME, and a month, date and day of the week calendar display which is initiated by DATE as illustrated in FIG. 4. The signal, DATE, is taken from the Q output of flip-flop 128 and is coupled to the display driver wherein it is used to enable the date identifier. The signal, DTIME, is taken from the $\overline{Q}$ output of flip-flop 128 and is coupled to ROM 30 to provide the proper address codes for the display for main storage RAM 52.

DTIME is also coupled to NOR gate 130 to generate five second delay request 1, 5 SEC DLY REQ 1. The other inputs to NOR gate 130 are the timeset signal, TS and the five second delay request 2, 5 SEC DLY REQ 2, which signal is described below. The resulting product from gate 130 generates 5 SEC DLY REQ 1. 5 SEC DLY REQ 1 is thus inhibited if in timeset or if a 5 SEC DLY REQ 2 is active. 5 SEC DLY REQ 1 as discussed in greater detail with respect to FIG. 12 causes the 5 second reset 1, 5 SEC RST 1, to go active at one of the inputs to AND gate 129. Ultimately, this causes flip-flop 128, which is reset active low, to be reset or to be returned to the normal time display, DTIME, hence the five second timeout illustrated in FIG. 4. The inhibits on gate 130 thus disable this timeout when the calendar display is being timeset or a display is exited to enter a stopwatch mode. The $\overline{T}$ input to flip-flop 128 is the output of NAND gate 132. This signal is the OR function of timeset, TS and alarm display, ALD. Thus, flip-flop 128 will not toggle when in alarm display or timeset, and the watch will remain either in the time or calendar display state in which it was initialized.

Toggle flip-flop 131 allows the user to program the watch to an hours, minute, date display in both zone I or zone II from the month, date and day of the week display. The T input of flip-flop 131 is coupled to the switch signal, SW1, while flip-flop 131 is clocked on the falling edge of 5 SEC RST 1. The $\overline{Q}$ output of flip-flop 131 is then coupled to a group of logic gates 133 to ultimately generate the signal display B, DISB, which is clocked through inverter 135 during T1. Since SW1 is activated, flip-flop 128 will also be toggled to change the state of the signal, DTIME, to ultimately generate through gate 130, 5 SEC DLY REQ 1, which after 5 seconds, will activate 5 SEC RST 1 to cause flip-flop 131 to be clocked. However, if the state of SW1 has changed by the user's release of switch S1, flip-flop 131 will not toggle on the clock and revert back to whichever state is defined by flip-flop 128. in other words, if switch S1 is maintained closed for 5 seconds and during the fifth second at which the timeout signal, 5 SEC RST 1, goes active, the clock display will change from month, date, day to hours, minutes, date. A similar timed closure of S1 is required to retoggle flip-flops 128 and 131 to return to the initial state as illustrated in FIG. 4.

However, when the watch display shows months, date and day of the week, a closure of S1 will cause flip-flop 128 to change state and revert to the display of hours, minutes and seconds. This return also will automatically occur as shown in FIG. 4 by a five second timeout from the month, date and day of the week display. 5 SEC RST 1 is coupled to gate 129 whose other input is TS. The output of gate 129 is an input to NOR gate 268, whose other inputs are ALD, the master reset, MRST, and SW.ZONE 2C. Thus, when 5 SEC RST 1 goes active in a non-timeset mode, flip-flop 128 will be reset on the active low output of gate 268 providing the output of gate 268 is not disabled by the signal stopwatch, SW, described below, or MRST. Once in the months, date and day calendar display, a closure of switch S1 will then toggle the watch display back either to hours, minutes, and seconds, or hours, minutes, and date display whichever was last condition set up within flip-flop 131.

Consider now the logic group 133. AND gate 137 has as its inputs zone 2C and SW, the signal signifying that the watch is in the stop watch mode generated by the circuitry of FIG. 6. The output of gate 137 is coupled to OR gate 139. The other inputs to OR gate 139 are the $\overline{Q}$ outputs of flip-flop 131, ALD and TS. The output of OR gate 139 is coupled to the input of NAND gate 141. The other input to NAND gate 141 is the signal DTIME. The output of NAND gate 141 is inverted and clocked by timing signal T1 in circuit 135 to produce the signal DISB. DISB prevents the month, date and day of the week display from being called out from display ROM 30 by ensuring that only hours, minutes and seconds are displayed. As shown in the equation illustrated below, which can be easily verified from logic group 133, DISB will be true only when flip-flop 128 is set in the state to display hours, and minutes, and not month and date, and one of the following: (1) the watch is in timeset; (2) is in alarm display; (3) is not in the hours, minutes, date display; or (4) is in the stopwatch mode, which is necessarily zone II by design choice.

$$[SW\cdot ZONE2C+\overline{Q}(131)+ALD+TS]DTIME\cdot T1=DISB.$$

In each of these cases an hours, minutes and seconds display only is desired if DTIME is active.

STOPWATCH MODE

As previously stated, if S3 is maintained closed for more than 5 seconds while displaying zone I, the stopwatch will be activated as shown in FIG. 4. The stopwatch mode is comprised of a chronograph and pause configuration signified by the identifiers "C" and "P", respectively. By design convention the zone I watch is converted into and used as a stopwatch. The closure of switch, S2, will allow the user to alternate between the pause and chronograph mode at will. The stopwatch, in either configuration, is coupled through various states by closures of switch S1. The chronograph configuration is provided with three states, namely reset, run and stop. Similarly, the pause configuration is provided with three states after the initial reset, namely run, stop and a pause-reset. Closure of switch S3 at any time during the stopwatch operation will cause the stopwatch display to terminate, although the stopwatch operation continues in the configuration and state from which it is exited. The alarm is automatically set in a 24 hour time-keeping mode when used with the stopwatch and may be employed as an interval timer.

The chronograph configuration operates as an ordinary stopwatch with the count beginning on the first closure of S1, stopped in the second closure of S1 and reset to zero in the third closure of S1. The pause configuration operates as a pause and cumulative stopwatch with the count beginning on the first closure of S1 and stopped on the second closure of S1. The count can be continued and accumulated by a third closure wherein it may be alternated between running and being frozen. If switch S1 is maintained closed greater than a delay period of $2\frac{1}{2}$ seconds it is then reset to zero in the pause configuration from the state in which the display and count is frozen.

The FIG. 6 illustrates the stopwatch state counter 140. The stopwatch cycles through three states and thus requires a three state counter for control. The T input to toggle flip-flop 142 is the internal control signal II which as illustrated in FIG. 7 as the logical product function of the signals, ZONE 2C, TSL, and SW3, derived from NAND gate 143. The Q output of flip-flop 142 is the stopwatch signal, SW, which indicates that the stopwatch mode is entered. The Q output of flip-flop 142 is coupled to the $\overline{RESET}$, $\overline{R}$, terminal of toggle flip-flop 144 which terminal is active low. The clock input of flip-flop 142 is coupled to the signal, 5 SEC RST 2, which will be generated after a 5 second delay of the closure of switch S3. Thus, S3 must be closed by the user for 5 seconds in order to enter the stopwatch mode as shown in FIG. 4.

Flip-flop 142 toggles on the rising edge of its clock, 5 SEC RST 2. Flip-flop 144, however, is clocked on the switch closure SW2 and will thus indicate whether the stopwatch is in the chronograph configuration represented by the identifier "C" or in the pause configuration represented by the identifier "P" as shown in FIG. 4. The Q output of toggle flip-flop 144 is the signal, PAUSE. Since $\overline{R}$ of flip-flop 144 is coupled to SW, flip-flop 144 will be in the chronograph configuration initially and will be free to toggle on a true T input on each S2 switch closure as illustrated in FIG. 4.

Flip-flops 150 and 154 form a three state counter which cycles respectively through the states (10), (11) and (01) as defined by their Q outputs respectively. Each of D-type flip-flops 150 and 154 are clocked on the falling edge of a signal X, which as shown in FIG. 7 is logically equivalent to the complement of the closure of switch 1 when in the stop-watch mode and ZONE 2C as generated by NAND gate 155, $$X=[\overline{SW\cdot ZONE\ 2C\cdot SW1}].$$

The state (10) refers to the reset stopwatch state, the state (11) represents the running state and the state (01) represents the time stopped state. In the pause configuration by recycling between the run and stop states rather than recycling to the reset state, it is possible to provide a pause and chronograph stopwatch function without additional control hardware.

The Q output of flip-flop 150 is coupled through NOR gate 162 to the $\overline{D}$ input of flip-flop 154. The Q output of flip-flop 154 in turn is coupled to one input of AND gate 164 whose output serves as the other input to NOR gate 162. The Q output of flip-flop 154 is also coupled to one input of NAND gate 152 whose other input is the Q output of flip-flop 150. The output of NAND gate 152 is coupled to the D input of flip-flop 150. The remaining input to AND gate 164 is the control signal, PAUSE, from the Q output of flip-flop 144. Therefore, when PAUSE is false, the Q output of flip-flop 150 is merely inverted, or equivalently coupled to the D input of flip-flop 154. Thus, it can be easily verified that if the flip-flops are initialized in the state (00) they will cycle through the states (10), (11), (01) and back to (10). However, if PAUSE is true, the Q output of flip-flop 154 is fed back through gates 164 and 162 into the $\overline{D}$ input of flip-flop 154. Thus, instead of the Q output effectively being coupled to the $\overline{D}$ input of flip-flop 154 it is coupled through a NOR gate to the D input with the Q output of flip-flop 150 serving as the other input to the NOR gate. It can also be easily verified that beginning with the initialized state (00) the flip-flops 150 and 154 respectively will cycle through the states (10), (11), (01) and then will alternate between the states (11) and (01) on each clock or closure of switch S1. These are in fact the control sequences as illustrated in FIG. 4.

The Q output of flip-flop 150 and the $\overline{Q}$ output of flip-flop 154 are coupled together with $\overline{ZONE\ 2C}$ to NOR gate 166 whose output in turn is coupled to the T input of Flip-flop 144. Thus, flip-flop 144 can only be toggled when the output of NOR gate 166 is true. This in turn is the case only when flip-flops 150 and 154 are in the state (10) which is the reset state of the stopwatch. Thus, as illustrated in FIG. 4, switch S2 closures will toggle flip-flop 144 between the chronograph and pause configurations only in the (10) state and all other switch 2 closures will be ineffective.

However, flip-flops 154 and 150 can be reset to the state (10) by a closure of switch S1 when the 2.5 second reset signal is active in the case of the pause configuration. For example, the Q output of flip-flop 150 will be set through the S terminal of flip-flop 150 whenever in the stopwatch mode, SW=1 and 2.5 SEC RST is true. This is accomplished by means of the inverted output of NOR gate 151 being coupled to the S input of flip-flop 150. The inputs to NOR gate 151 are the inverted output of NAND gate 158 and the output of AND gate 153. The inputs to NAND gate 158 are the signals ZONE 2C, 2.5 SEC RST and SW, which provide the desired resetting signal. The inputs to AND gate 153 are the signals SW, II, and 5 SEC RST 2. This will provide a stopwatch resetting mode on an S3 closure in coincidence with the 5 second reset 2 signal. As shown in FIG. 4, an S3 closure in coincidence with 5 second reset 2 signal causes the stopwatch mode to be entered and in so doing flip-flop 150 is set. Flip-flop 154 is reset by the output of NAND gate 156. The inputs to NAND gate 156 are in turn the output of NOR gate 148 and the output of NAND gate 158 each described above. Thus, flip-flop 154 will be reinitialized either on the condition that the 2.5 second reset signal goes active during a switch S1 closure or upon initial entry into the stopwatch configuration on a S3 closure during the 5 second reset 2 signal as verified by FIG. 4.

The $\overline{\text{RESET}}$ input to flip-flop 150 is coupled to NOR gate 148 whose inputs in turn are coupled to AND gate 146 and the master reset signal, MRST. AND gate 146 has three inputs, namely, the $\overline{\text{SW}}$, 5 SEC RST 2 and the signal II, which is SW3.TSL.ZONE 2C. Therefore, the Q output of flip-flop 150 is reset whenever each of the following simultaneously occur: the watch is not in the stopwatch configuration; the 5 second reset signal 2 is active; and whenever an S3 closure is made not in timeset while the watch is in zone II. Each of these conditions mark an S3 closure which exits the stopwatch mode as opposed to entry into the stopwatch mode. A switch S3 closure causes flip-flop 142 to be reset, stopwatch to be exited and simultaneously advances the main segment display counter including flip-flops 134 and 138 to the alarm display mode as illustrated in FIG. 4.

Certain internal control signals and delay requests are produced as a result of the states set up within stopwatch state counter 140. For example, the Q and $\overline{\text{Q}}$ outputs of flip-flop 150 and the Q output of flip-flop 154 are coupled to a logic circuit 167 whose output is the signal STOP C which will direct the watch to stop counting when in the stop states of either of the stopwatch configurations. It can be easily verified that logic gate 167 has a false output at all times except when flip-flops 150 and 154 assume (01) and (10) states.

The 2.5 second delay request signal is generated by the inverted output of NAND gate 169 whose inputs are SW1, the Q output of flip-flop 154, ZONE 2C, and PAUSE. Thus, as verified by FIG. 4, when in either of the states (11) or (01), if an S2 closure occurs while in the zone II watch during the PAUSE configuration, the 2.5 second delay request signal will be generated.

The signal RESETM is derived from NOR gate 166, which as described above, will be true when flip-flops 150 and 154 are in the state (10). RESETM will be used to reset the contents of the stopwatch to zero as discussed below. The 5 SEC DLY REQ 2 signal used upon entry of an S3 closure into the stopwatch mode is generated in response to the output of NAND gate 171 whose inputs are SW3.TSL and ZONE 2C. The output of NAND gate 171 is coupled directly to the reset terminal of latch 173 and through two inverter stages to the set terminal of the same latch. Since, normally SW3 is low, a true input will be presented to the set and reset terminals of RS NOR latch 173. The output of latch 173, 5 SEC DLY REQ 2, will therefore be low. However, when a switch S3 closure occurs, the reset terminal goes false before the set terminal by reason of the propagation delay through the two inverters which couple the output of NAND gate 171 to the set terminal of latch 173. 5 SEC DLY 2 will then be set and remain set until 5 SEC RST 2 goes active at the reset input of latch 173, thereby extinguishing 5 SEC DLY REQ 2.

ALARM DISPLAY

The state counter for the alarm display is illustrated in FIG. 8. Referring now to FIG. 8, the two state state counter required by the alarm is provided by toggle flip-flop 204. Flip-flop 204 distinguishes the alarm between the armed and disarmed states. Flip-flop 206 causes either zone I or zone II to be accessed for an alarm comparison as described below. Flip-flops 204 and 206 are clocked on the rising edge of switch signal SW1. Flip-flop 204 has a $\overline{\text{T}}$ input coupled to NAND gate 208 whose inputs in turn are ALD and $\overline{\text{TS}}$. In other words, whenever the watch is not in timeset and is in alarm display, flip-flop 204 can be toggled on S1 closures. Flip-flop 206 selects between alarm setting in either zone I or zone II during timeset as will be described in greater detail below. The $\overline{\text{RESET}}$ input to flip-flop 204 is coupled to NOR gate 210 whose inputs in turn are MRST, the output of AND gate 212 and the output of NOR gate 214. The input to AND gate 212 is in turn SW3 and ALC, which is alarm compare and which is generated, as described below, when an alarm signal is to be triggered. The inputs to NOR gate 214 are ALC, $\overline{\text{ALD}}$ and $\overline{\text{TS}}$. Therefore, it can easily be verified that flip-flop 204 will be in the reset condition or unconditionally disarmed when not being master reset and whenever being timeset in the alarm display as long as there is no alarm trigger then being generated. NAND gate 207 generates an alarm blanking signal, $\overline{\text{A Blank}}$, which causes the designator AL displayed as digits 5 and 6 to flash at a 2 hertz rate when the alarm is being timeset and armed as shown in FIG. 11. NAND gate 209 generates an alarm reset signal, ALRST, which is active during an alarm display on an S2 closure during the timeset state (1,0). In other words the alarm storage is reset to zero upon entering an hours alarm timeset as illustrated in FIG. 11.

Another portion of the alarm circuitry is shown in FIG. 5 wherein a 10 SEC DLY REQ 2 and alarm enable, ALEN, are generated by use of D-type flip-flops 216 and 218 each of which are clocked on the falling edge of a signal, BEEP. BEEP is a clock frequency derived by conventional means from the prescale divider by combining the 4 $\overline{\text{HERTZ}}$ signal with the 1 $\overline{\text{HERTZ}}$ signal in a NOR gate to give a 4 HERTZ burst with a 1 HERTZ group repetition rate, or two beeps every second with a 50% duty cycle. The D input to flip-flop 216 is tied to VDD or set to 1. The Q output of flip-flop 216 is coupled directly to the D input of flip-flop 218. The Q output of flip-flop 218 is the 10 SEC DLY REQ 2 signal. Thus, flip-flops 216 and 218, from an initial condition (00), transfer to the states (10) and (11) where they remain fixed. However, the $\overline{\text{RESET}}$ inputs to flip-flops 216 and 218 are coupled through an inverter to NAND gate 220. The inputs to NAND gate 220 are the signal ARMED or the Q output of flip-flop 204, the signal ALC, indicating an alarm trigger, and the output of RS NAND latch 222. The set input to latch 222 is the 10 SEC RST 2 signal while the reset terminal is coupled to ALC.

The alarm enable signal, ALEN, is the signal which actuates the transducer to produce the 2.048 kilohertz tone as shown in FIG. 9. ALEN is generated from NAND gate 224. The inputs to NAND gate 224 are $\overline{\text{MRST}}$ and the output of NAND gate 226. NAND gate 226 has as its inputs the signal BEEP, the inverted output of NAND gate 228 and the $\overline{Q}$ output of flip-flop 218. The inputs to NAND gate 228 are ALC and ARMED. Thus, it can be easily verified that alarm enable will be true whenever the master reset is active thereby providing a power-up test of the alarm transducer or when the output of NAND gate 226 is false. The output of NAND gate 226 will only be false when the signals BEEP, ALC, ARMED and the $\overline{Q}$ output of flip-flop 218 are all true. In other words, when the alarm is triggered and armed only the first 2 pulses of the 4 hertz BEEP signal will be coupled through. In other words, on the alarm, the user will hear a double beep and then silence. However, the 10 SEC DLY REQ 2 simultaneously went active on the alarm trigger. After 10 seconds of silence, the 10 SEC RST 2 goes true and RS latch 222 is reset. This causes flip-flops 216 and 218 to be latched into the (00) state allowing for a continuous alarm according to the signal, BEEP. The alarm will continue for 60 seconds, at which time the minutes unit digit of the selected watch zone is incremented and ALC will indicate that no valid comparison then exists.

FIG. 9 illustrates an alarm driver circuit which is particularly characterized by the absence of any need for a coil or capacitor to generate high voltage driving signals to a piezoelectric transducer. A conventional piezoelectric transducer 231 is provided with a first terminal 233 and a second terminal 235. The alarm enable signal, ALEN, is coupled to a first NAND gate 237 and second NAND gate 239. ALEN is used as an enabling signal for gates 237 and 239 causing an N-type device to become conductive and allowing the gate to be coupled to ground. The input to inverter 237 is coupled to a periodic signal, namely a 2 kilohertz signal tapped from timing and prescale generator 24. The input to NAND gate 239 is coupled to the output of gate 237. The output of gate 237 is also coupled to the input of the third NAND gate 241. The output of gate 239 is coupled to the input of NAND gate 243. The outputs of inverters 241 and 243 are coupled respectively to terminals 233 and 235 of transducer 231. P-type pullup devices 245 and 247 are provided for the outputs of gates 237 and 239 and are gated by ALEN. Thus, when ALEN is true the 2 kilohertz signal is provided to terminals 233 and 235 in an out-of-phase relationship thereby driving transducer 231 with a low voltage, out-of-phase, signal. However, when ALEN is false, gates 237 and 239 are disabled and the inputs to inverters 241 and 243 are held high thereby maintaining terminals 233 and 235 at a fixed and substantially equal potential. Therefore, by using the circuitry as illustrated in FIG. 9 of the present invention, an audible signal may be generated by transducer 231 by selectively coupling the terminals of the transducer to a low voltage, out of phase, driving signal.

TIMESET MODE

Either the zone I or zone II watch may be timeset or initialized as diagrammatically illustrated in FIG. 10. S2 is used to enter and sequence through each of the timeset stages from the normal time display and calendar display configurations. Closure of S3 is used throughout timeset to escape the timeset mode. The digits are advanced at a 2 hertz rate upon closure of the switch S1. The automatic return is provided from the hours timeset configuration if there is no time setting within a 10 second interval. In the present embodiment, during timeset, the colon is held constant while the digit, which is to be set, flashes. While in the hours timeset state in either zone watch, if S2 is held closed more than 5 seconds then the counting mode will be alternated between a 12 and 24 hour counting mode except when timesetting during the calendar display mode as illustrated in FIG. 10. The seconds digit cannot be cycled or arbitrarily set but only reset to zero. To set seconds, the timeset mode is entered from the normal time display by multiple activations of switch S2. When the seconds timeset is reached closure of switch S1 will cause the seconds to be reset and time frozen. A second closure of switch S1 will cause the seconds to run but in a timeset mode. A third closure of switch S1 will reset seconds and cause the time to be frozen. The watch can be alternated between these two states by closure of S1 and escaped either by closure of S2 or S3 which will start the watch running and return to the normal time display. Similarly, calendar timeset is entered from the normal calendar display and thereafter followed by closures of switch S2 to enter the month, date and day timesets as illustrated in FIG. 10.

The timeset and alarmset state counter 230 is illustrated in FIG. 7. D-type flip-flop 232 generates the timeset signal, TS, at its Q output. Flip-flop 232 as well as D-type flip-flops 234 and 236 are clocked on the rising edge of SW2. The input to the D input to flip-flop 232 is derived from NOR gate 238 whose inputs are the inverted output of NAND gate 240, the output of NOR gate 242 and the output of NOR gate 244. The inputs to NOR gate 244 are DTIME, $\overline{\text{TA}}$ and $\overline{\text{TB}}$. $\overline{\text{TA}}$ and $\overline{\text{TB}}$ are the $\overline{Q}$ outputs from flip-flops 234 and 236 respectively. By reference to FIG. 10, it is clear that during timeset from the normal time display, i.e., DTIME=1, the timeset counter must cycle through hour, minutes tens, minutes units and seconds timeset, or four states. However, during the normal calendar display or DTIME=0, the timeset cycles through three states, months, date and day. Flip-flops 234 and 236 effect this double sequence. Assume DTIME is true or DATE false. The output of AND gate 248 will then be held false. The output of AND gate 248 is coupled to NOR gate 250 which in turn is coupled to the D input of flip-flop 236. Thus, the other input to NOR gate 250, $\overline{\text{TA}}$ from flip-flop 234 will be normally inverted. $\overline{\text{TB}}$ is directly coupled to the D input of flip-flop 234. It can be easily verified that when flip-flops 234 and 236 are thus coupled, the TA and TB values cycle through the states (00) on initially being reset, and then through (10), (11), (01) and then back to (00). However, when DTIME is 0 or DATE is 1, AND gate 248 couples TB to the other input of NOR gate 250. The D input to flip-flop 236 now is presented either with a zero or the Q output of flip-flop 234 according to the value of TB. Again, it can be easily verified that flip-flops 234 and 236 will then cycle through the initial reset state (00) to (10), (11) and back to (00). These states correspond respectively to months, date and day of the week as illustrated in FIG. 10.

Consider now the D input to flip-flop 232 which when true and clocked by SW2 causes the timeset indicator, TS to go true indicating the entry into and status of being in the timeset mode. As illustrated in FIG. 10, timeset is entered from the calendar or time display to the month and hours timeset states respectively. Similarly, timeset is exited on a switch S2 closure. Consider the following input circuitry to flip-flop 232. The output of gate 238 goes true upon the coincidence of the following conditions. When the watch is not in the stopwatch configuration in zone II, the output of gate 240 goes true. This condition is necessary because closure of switch S2 is used to program the stopwatch between the chronograph and the pause modes. The second condition is that the timeset state counter 230 not be in the state (01) on an Sw2 clock. As illustrated in FIG. 10, closure of a switch S2 in the (01) state must cause exit from the timeset mode. Thus, on this condition the output of NOR gate 238 goes false causing TS to go false in response to the output from NOR gate 242. The last condition which must be met may be any one of three alternatives as provided by OR gate 244. Namely, flip-flop 234 is in the zero state or flip-flop 236 is in the zero state or the watch is in the normal time display. Thus, whenever in the time display mode, closure of switch S2 will cause timeset to be activated until the (01) state is reached at which time the output of NOR gate 238 will go false and timeset will be exited. Similarly, during calendar display, if either flip-flops 234 or 236 has a 0 state, namely months set or dates set, flip-flop 232 will be maintained in timeset, but NOR gate 238 will go false and timeset will be exited on a switch S2 closure when neither TA nor TB are false, namely an exit from the day timeset as shown in FIG. 4.

When in time display in the state (00) the watch may be configured either as a 12 hour watch or 24 hour watch. This is done in processor 78 and RAM 76 as described above by the use of signals 12C and 12D, described in greater detail in connection with FIG. 13. Flip-flop 232, FIG. 7, is reset, active low, by the output of NOR gate 252. The input to NOR gate 252 is AND gate 254, 10 SEC RST 1, master reset, MRST, and SW3. The inputs to AND gate 254 are ALC, the alarm trigger, and ARMED from flip-flop 204 in FIG. 8 indicating that the alarm is armed. Therefore, the output of NOR gate 252 will be false on a switch S3 closure, or on master reset, or whenever the 10 second reset signal is received, or when there is an alarm trigger when the alarm is armed. Both flip-flops 234 and 236 are reset, active low, by TS. Thus, as illustrated in FIG. 10, a switch S3 closure will exit the timeset mode at any point. Alternatively, the 12 and 24 hour hours-timeset will have a 10 second timeout which will automatically exit the timeset mode unless the switch S2 closure occurs in the interim. NAND gate 256 has as its inputs $\overline{SW2}$, $\overline{SW1}$, $\overline{ALD}$, TA.TB and DTIME. The inverted output of NAND gate 256 is 10 SEC REQ 1 which initiates the 10 second timeout. Therefore, the 10 second request will be valid as long as there is no switch S1 or S2 closure, the watch is in the time display mode in the hours timeset state and not in the alarm timeset mode. If switch S2 is closed, 10 SEC REQ 1 is removed and 10 SEC RST 1 will never go active as discussed below.

Flip-flop 260 generates a second reset signal $\overline{RSC'}$, which is used to reset seconds. D-type flip-flop 260 has its Q output fed back to its $\overline{D}$ input and is clocked by the output of NAND gate 262 whose inputs are SW1 and $\overline{TA}$.TB from the output of NOR gate 242. Flip-flop 260 is clocked on the falling edge of the clock pulse. Therefore, whenever SW1 is activated flip-flop 260 will toggle and is reset whenever the timeset mode is exited. The Q output of flip-flop 260 is coupled to NAND gate 264 whose other inputs are the output of NOR gate 242 and $\overline{ALD}$. Therefore, $\overline{RSC'}$ is active low during the (01) state, during a nonalarm display, and when flip-flop 260 is set as illustrated in FIG. 10 on alternative S1 closures.

The signal, cycle, $\overline{CYC}$ is generated by NAND gate 261. The inputs to gate 261 are TS, SW1 and NAND gates 263 and 265. Gate 263 has as its inputs ALD and $\overline{TA}$.$\overline{TB}$. Gate 265 has as its inputs $\overline{ALD}$ and $\overline{TA}$.TB. CYC, which is used as an input to the timing and prescale generator as in the Custom Watch to allow a digit to be incremented at the timeset rate usually 2 HERTZ. In other words, CYC is active whenever in timeset and S1 is closed except during the timeset seconds state (01) when S1 is used to only stop and start normal incrementation of seconds, and during alarm timeset in the zone select state (00) when S1 is used to select between the zone to which the alarm is armed.

ALARM TIMESET MODE

FIG. 11 illustrates the alarm timeset. In order to set the alarm, the watch must be sequenced to the normal alarm display mode by appropriate cycling with switch S3 as illustrated in FIG. 4 to the zone and display configuration desired. Thereafter, the timeset mode is entered by activating S2. In the preferred embodiment the colon is nonflashing and the a.m. or p.m. designator will be on if in the 12 hour timekeeping mode, and will be blank if in the 24 hour timekeeping mode. The alarm designator, AL, will flash if the alarm is armed, otherwise it will be constant if disarmed. The display will also have an indicator showing the zone in which the alarm has last been set, namely either the zone I or zone II watch. Alarm timeset is entered in either case by closure of switch S2. Exit at any time from the timeset mode is made throughout the timeset sequence by closure of switch S3 as shown in FIG. 11. A second closure of switch S2 will automatically reset the alarm to 0:00 a.m. in the 12 hours mode an 0:00 hours in the 24 hour mode. Repeated closures of switch S2 will then be used to sequence through hours, minutes tens and minutes units. In the preferred embodiment, seconds are not displayed nor can they be set in the alarm timeset mode although this feature could easily be included within the scope of the present invention. The alarm triggers when the second digits reaches 0 and continues through the 59th second. Thus, a maximum sixty second alarm will be sounded and then automatically disabled.

The alarm and timeset mode can be used to exactly synchronize the zone I and II watches. If the time designated as the alarm time is reached during a timeset operation in the other zone, then according to the present invention, timeset in the other zone will be terminated as discussed in relation to gate 254 in FIG. 7 and the watch, if time is frozen, will be started, when the alarm is triggered. Thus, by setting the alarm in zone I, for example, to a few minutes before the actual time kept in zone I and then setting zone II into alarm timeset mode, when the alarm is triggered in zone I, timeset in zone II will automatically be terminated and zone II will begin to count beginning with the same time as kept in zone I.

During alarm timeset display, state counter 126 of FIG. 5 will be in the alarm display mode during alarm timeset. ALD will be true. The output of NOR gate 268 shown in FIG. 5 will be false since it has ALD as an input. Thus, flip-flop 128 will be reset and DATE will be false. When DATE is false, timeset state counter 230 of FIG. 7 will be cycled through the states (00), (10), (11) and (01) on S2 closures as previously described. The (00) state will be the zone select state wherein alternate activation of switch S1 will select the alarm in either zone I or zone II. This is accomplished by toggle flip-flop 206 shown in FIG. 8 whose output is zone alarm control, ZAC. ZAC will multiplex the contents of one of the zone watches in the alarm RAM as shown and described in greater detail in connection with FIG. 14. In the (00) state, the referenced zone will be selected, in the (10) state, hours will be set, in the (11) state minutes tens, and in the (01) state minutes units. These states are offset from the normal time display timeset by conventional mapping within timeset PLA 266 shown and described in connection with FIG. 12.

TIME DELAY CIRCUITRY

The present invention uses the timed closure of a switch to allow the user to program the mode, configuration and state of the watch as well as the sequence of closures of multiple switches. FIG. 12 shows circuitry whereby certain reset signals are generated in response to the request signals. A fixed count such as 10 is selected. Various delays are measured by decrementing from the selected fixed count at different rates. A one, two and four hertz signal is tapped from prescale and timing generator 24. These signals are selectively tapped from generator 24 by request signals R1, R2 and R4 corresponding to the one, two and four hertz signals respectively by means of conventional transmission gates. The selected frequency is then coupled as an input controlling frequency for the T4 generator in the same manner as illustrated in regard to the Custom Watch. Thus, the T4 generator is selectively cycled at a 4, 2 or 1 hertz rate, depending upon the delay request, to produce, when counting from a maximum of 10, a 2.5 second, 5 second or 10 second delay respectively. It is to be understood, however, that other maximum limits could be obtained by employing the same methodology of the present invention. For example, a maximum count could be set at 12 to produce a 12 second, 6 second or 3 second delay by using the same 1, 2 and 4 hertz taps.

The request signals R1, R2 and R4 are generated as shown in FIG. 12 in response to a plurality of delay request signals. There are three 5 second delay requests, namely 5 SEC DLY REQ 1, 2 and 3, two 10 second delay requests, namely, 10 SEC DLY REQ 1 and 2, and one $2\frac{1}{2}$ second delay request, 2.5 SEC DLY REQ which necessarily is identical to the request signal R4. These requests are provided as inputs to the circuitry illustrated in FIG. 12 which generates the time delay resets. The reset signals in turn are provided as inputs and clocking signals to the circuits illustrated in FIGS. 5 through 8 which in turn generate the various request signals.

As in the Custom Watch, during T4 a separate address of main RAM storage 52, chosen by design to be a location in the zone I watch, is accessed together with the associated minterms in PLA 54 to perform the required timekeeping operation for time delay. In other words, a single storage location is accessed and decremented from to 10, 12 or such other limit value as may be chosen. The actual lapsed time is varied by altering the basic driving frequency for the T4 generator in the prescale divider 24. The ZERO signal, shown in FIG. 12, is the AND function of the four data bits of the output of main RAM 52 and thus indicates when the predetermined count has been exhausted. The ZERO signal, $\phi$ 2 and T4 timing signals are combined in NAND gate 170, inverted by inverter 172 and coupled to various inverters from whence the time delay resets are generated. Consider, for example, the 5 SEC RST 1 derived from the inverted output of inverter 176. The 5 SEC REQ 1 signal is coupled to N-type device 270 which forms part of inverter 176. The input to inverter 176 is coupled to the output of inverter 172 or to the product function which includes ZERO. Thus, when ZERO goes true, indicating that the selected count has been exhausted, the output of inverter 176 will be false if the 5 SEC DLY REQ 1 request has caused N-type device 270 to be conductive. This will in turn cause 5 SEC RST 1 to be true.

Similarly, 5 SEC RST 2 is derived from the output of inverter 272 which has an N-type device 274 coupled to 5 SEC DLY REQ 2 in an equivalent manner. 5 SEC RST 3 is equivalently derived from inverter 276 from 5 SEC DLY REQ 3. 10 SEC RST 1 is derived in the same manner from inverter 278 having its corresponding N-type device coupled to $\overline{\textbf{10 SEC DLY REQ 1}}$. In the same manner, 10 SEC DLY REQ 2 is derived from the un-inverted output of inverter 280 which has an N-type device coupled to 10 SEC DLY REQ 2. Inasmuch as there is only one $2\frac{1}{2}$ second, request R4 is directly coupled to inverter 174 as the $2\frac{1}{2}$ second delay request signal.

The $2\frac{1}{2}$ second delay request, and each of the 5 second delay requests and the NOR product of the 10 second requests from gate 284 are provided as inputs to NOR gate 282. The output of NOR gate 282 is the signal $\overline{\text{DLY REQ}}$ which is active when any one of these delay requests have been made. Both of the 10 SEC DLY REQ are coupled as inputs to NOR gate 284 whose inverted output is the request signal R1 indicating that a one hertz driving frequency is required from generator 24 for the delay. The $2\frac{1}{2}$ second request signal is coupled together with R1 to NOR gate 286 to generate R2 for 5 second requests. Clearly, any request which is not a 10 second request or a $2\frac{1}{2}$ second request must call for a 5 second request or a two hertz driving rate. The general delay request, DLY REQ, is coupled together with delay reset 1, DLY RST 1, to the inputs of NOR gate 288. The output of NOR gate 288 is coupled to the active low reset terminal of D-type flip-flop 290 which is clocked by the falling edge of T4. The D input of flip-flop 290 is coupled to VDD or is 1. Thus, when a delay request has been received and DLY RST 1 is generated, the Q output of flip-flop 290 will go true. Delay request, DLYRST, is used as in the Custom Watch in the prescale divider and timing circuitry to initiate the T4 requests and cause the T4 generator to begin counting. DLYRST 1 is generated by NAND gate 291 in FIG. 5 from the inputs 5 SEC DLY REQ 1 and 5 SEC DLY REQ 2. NAND gate 291 and DLYRST 1 are employed to resolve conflicts between 5 SEC DLY REQ 1 and 2 which may occur in the situation depicted in FIG. 4 wherein a five second timeout is initiated between various display configurations on an S1 closure and upon entry into the stopwatch mode on an S3 closure. Upon a conflict, DLYRST 1 goes true, gate 288 goes false, flip-flop 290 is reset and the time delay is reset.

FLAG RAM ADDRESS GENERATOR

The address generator for the generation of the RAM address signals 12C, 12D, alarm control, watch control and zone control is illustrated in FIG. 13. The address signals are generated, in part, from three latches which in turn have inputs derived from SW, change zone alarm, CZA and 5 SEC RST 3. Latch 320 has an output 12/24 which indicates that a transition between a twelve or twenty-four hour timekeeping mode is being made. Latch 318 has an output RESET which is indicative of a request for a twelve hour timekeeping mode. Latch 292 has the output, alarm change, ALCHNG, which indicates in response to CZA, change zone alarm, that the zone which is to be armed is to be changed. All three latches are reset once on each complete display scan of the digits by the output of NOR gate 296.

CZA is coupled through transmission gate 288 which is gated by $\overline{T1}$. The inverted output of transmission gate 288 is coupled to NOR gate 290 together with CZA. The residual capacitance of transmission gate 288 momentarily holds one input to gate 290 at the old inverted value for CZA, such that when CZA goes active low a single pulse of sufficient duration will be generated to indicate the CZA is active low. CZA is generated by NAND gate 294 in FIG. 7. The inputs to NAND gate 294 are TS, TA, $\overline{TB}$ and ALD. Thus, CZA is active low during the (10) state of alarm timeset or during the first alarm timeset state, hours alarm timeset.

The output of NOR gate 290 is then coupled to the set terminal of RS NOR latch 292. The output of latch 292 is the signal alarm change, ALCHG, which indicates that the watch zone which is being armed with alarm is being changed. Therefore, RS latch 292, which will normally then be reset by the inverted output of NOR gate 296 will be set on CZA. CZA is synchronized to T1 since both signals ultimately are clocked on the same tap in timing and prescale generator 24. The inputs to NOR gate 296 are the master reset MRST and a digit synchronizing signal which is arbitrarily chosen to be DG3. Any digit signal could have been chosen since the digit signals are sequentially activated as in the Custom Watch. This ensures an active output through NOR gate 296 at least once during each digit cycle while master reset is inactive. The output of latch 292 is coupled to NAND gate 298 whose other input is coupled to T1' of timing circuit 300, which as described below, ensures that the address which is generated is active for a full cycle of the T generator. The inverted output of NAND gate 298 is then coupled to AND gate 302 whose other input is the zone alarm control signal, ZAC generated by flip-flop 206 as discussed in connection with FIG. 8. ZAC is indicative of zone II being accessed for alarm compare as previously discussed. The output of AND gate 302 is coupled to OR gate 304 whose other input is the timing signal ZONE I/O. The output of OR gate 304 is coupled to NAND gate 306 whose other inputs are the clock signals $\phi$ 4 and $\overline{\phi\ 1}$. Thus, the address, ZONECTRL, which is active when zone II of the watch is being accessed, is given by the following equation:

$$\text{ZONE CTRL} = \overline{\phi 1} \cdot \phi 4.$$

$$[\text{ZONE I/O} + \text{ZAC} \cdot \text{ALCHG} \cdot \text{T1}']$$

Where ZONE I/O is a timing signal derived by conventional random logic in prescale divider and timing generator 24 given by the following equation:

$$\text{ZONE IO} = \text{T3} + \text{T1} \cdot \text{ZONE 2C}.$$

ZONECTRL then is active whenever zone II is being displayed or the subject of manipulation, that is when zone II is being displayed, incremented or having its alarm set and armed.

Similarly, the address for zone I, watch control, is derived from NOR gate 308. The inputs to NOR gate 308 are the output of NAND gate 298 and ZAC. The output of NOR gate 308 is coupled to OR gate 310 whose other input is watch I/O. The output of OR gate 310 is coupled together with $\overline{\phi\ 1}$ as the inputs to NAND gate 312. The output of NAND gate 312 is the watch address, $\overline{\text{WTHCTRL}}$. Thus, the address, WTHCTRL, is given by the following equation:

$$\text{WTHCTRL} = \phi 1.$$

$$[\text{WATCH I/O} + \overline{\text{ZAC}} \cdot \text{ALCHG} \cdot \text{T1}']$$

Where WATCH I/O again is a timing signal generated from prescale and timing generator 24 by conventional random logic according to the following equation:

$$\text{WATCH I/O} = \text{T1} \cdot \text{ZONE 1C} + \text{T2} + \text{T4}$$

Thus the zone I portion of RAM 52 and 64 is addressed whenever zone I is being displayed, incremented, alarm armed or when a delay is being executed.

Finally, the alarm control address $\overline{\text{ALCTRL}}$ is generated from OR gate 314 having inputs $\phi$ 4 and AND gate 298 coupled to NAND gate 316 whose inputs also include $\overline{\phi\ 1}$ and alarm I/O. The equation for alarm control, ALCTRL, then becomes:

$$\text{ALCTRL} = \text{ALARM I/O} \cdot \overline{\phi 1}[\phi 4 + \overline{\text{ALCHG} \cdot \text{T1}'}]$$

Where alarm I/O is derived from standard random logic according to the equation:

$$\text{ALARM I/O} = \text{ALD} \cdot \text{T1}.$$

RS latches 318 and 320 are employed to generate the 12 and 24 hours control signals 12C and 12D. Transmission gates 322 and 324 together with inverters 328 form a storage cell for RESET M that stores the value for RESET M on each T1. Since the midpoint of the storage cell, which has the value of $\overline{\text{RESET M}}$ stored during the last preceding T1 clock, is compared against the present value, the inverted output of AND gate 326 will be true on the positive transition of RESET M until the next positive edge of T1. The output of NAND gate 326 is inverted and provided as one of the inputs to NOR gate 338. The inverted output of NOR gate 326 is then coupled to the set terminal of RS latch 318. The output of RS latch 318, RESET, is coupled to logic gate 330 whose other inputs are T1' and $\phi$ 3. The output of gate 330 is the data signal 12D. Thus, 12D is false only when $\phi$ 3, RESET and T1' are true, otherwise it is indeterminate, thereby allowing 12C to invert the value for the 12 flag on $\phi$ 4 by inverter 122. When 12D goes false, inverter 122 enters a one for flag 12 as shown in FIG. 2b indicating a 12 hour timekeeping mode.

The set terminal of RS latch 320 is coupled to 5 SEC RST 3. The output of latch 320, 12/24, is coupled to OR gate 332 whose other input is coupled to RESET. The output of OR gate 332 is coupled to NAND gate 334 whose other input is T1′. The output of NAND gate 334 in turn is coupled to NOR gate 336 whose other input is $\phi$ 4. The output of NOR gate 336 is the address control signal 12C which is then given by the equation:

$$12C=\phi 4 \cdot T1' \cdot [12/24+RESET]$$

12C is used as the enabling signal to inverter 122 of FIG. *2b* corresponding to the 12 flag. Twelve or twenty-four hour operation in zone I or zone II is programmed by holding switch S2 closed more than 5 seconds to initiate 5 SEC RST 3 in the hours timeset configuration as shown in FIG. 10. If the watch was previously counting in the 24 hour mode, it will then count in the 12 hour mode and visa versa, i.e., inverter 122 complements the 12 flag. 5 SEC RST 3 is generated in response to 5 SEC DLY REQ 3 generated by RS NOR latch 319 in FIG. 6. The set input to latch 319 is derived from two serially connected inverters 321 which have an input from NAND gate 323. One of the reset terminals of latch 319 is also coupled to the output of NAND gate 323. The other reset terminal to latch 319 is coupled to 5 SEC RST 3. The inputs of NAND gate 323 are TS, hours-month, DTIME, SW2 and $\overline{\text{ALD}}$. The signal hours-month, HRS-MTH is generated by NOR gate 325 shown in FIG. 7. The inputs to NOR gate 325 are TA and TB from the timeset state counter 230. Thus, hours-months is true only when the timeset state counter is in the state (00) or when either the hours or month is being timeset in the time display or calendar configurations respectively. Therefore, the output of NAND gate 323 is active low only when in the time display, and timeset, not in alarm display, in the hours timeset state and upon activation of switch S2 as illustrated in FIG. 10. Therefore, normally the inputs to latch 319 are both set true and the output of latch 319 will be false indicating that no 5 SEC DLY REQ 3 is indicated. However, when AND gate 323 goes low the reset input to latch 319 will go low first due to the propagation delay provided by inverters 321. Latch 319 will then be set and remain set until the 5 SEC RST 3 is generated as described above. In this manner, 5 SEC RST 3 generated in response to 5 SEC DLY REQ 3 can be used to program the watch in a 12 or 24 hour time-keeping mode.

FLAG TIMING GENERATOR

Circuit 300, which generates T1′, is activated through NOR gate 338 to go active when any of the control signals 12C, 12D, alarm control, watch control or zone control are activated. In other words, NOR gate 338 has its inputs coupled to the inverted output of NAND gate 326, to NOR gate 290 and to 5 SEC RST 3. The inverted output of NOR gate 338 is coupled to the set input of RS NOR latch 340 and the reset input to RS NOR latch 342. The output of latch 340 is the control signal ZRAM which will zero the contents of the accessed zone of the main RAM. The output of RS latch 340 is coupled to the D input of D-type flip-flop 344 which is clocked by one of the digit scan signals for example, DG3. The $\overline{\text{Q}}$ output of flip-flop 344 is coupled to OR gate 346 whose output in turn is coupled to NAND gate 348. The output of NAND gate 348, whose other input is $\overline{\text{MRST}}$, is coupled to the reset input of RS latch 340.

When an address request is being generated the set input of latch 340 goes true. A one is then coupled into the $\overline{\text{D}}$ input of flip-flop 344 which is clocked on the rising edge of a selected one of the digit scan signals, in this example, $\overline{\text{DG3}}$. On the first scan through the digits, a zero is then placed on the $\overline{\text{Q}}$ output of flip-flop 344 and coupled to OR gate 346. The other input to OR gate 346 is the clock signal $\overline{\text{DG3}}$. At this point $\overline{\text{DG3}}$ has just gone true and since $\overline{\text{MRST}}$ is normally true a zero will coupled to through NAND gate 348 to the reset input of latch 340. However, on the next digit scan when $\overline{\text{DG3}}$ goes false on its falling edge, the inputs to OR gate 346 will both be false. Thus, a one will be coupled through gate 348 to reset input of latch 340. The output of latch 340 will go false such that when $\overline{\text{DG3}}$ goes true on its rising edge a one will be coupled to the input of OR gate 336.

Latch 342 has its output coupled to the $\overline{\text{D}}$ input of D-type flip-flop 350 which is clocked on the T1 clock and reset on master reset, MRST. The $\overline{\text{Q}}$ output of flip-flop 350 is coupled to NOR gate 352 whose other input is coupled to $\overline{\text{T1}}$. The output of NOR gate 352 is coupled back to the set input of latch 342 which also has an additional set input to MRST. Thus, when activated the output of latch 342 is reset to 0. On the first T1 clock the $\overline{\text{Q}}$ output of flip-flop 350 goes false. Since flip-flop 350 is clocked on the falling edge of T1, T1 will then be false at the input to NOR gate 352 whose other input will be true. Thus, the output of NOR gate 352 will be false. However, when the next T1 clock goes true the output of gate 352 will go true and remain true until the falling edge of that T1 clock at which time the output will go false, assuming that an address request is being made. At all other times when an address request is not being made, RS latch 342 will be reset and the output of NOR gate 352 maintained false. In this manner, regardless of when then address request was generated, the address request will remain valid for a full T clock period by reason of T1′, the output of gate 352, coupled to gates 334, 330 and 298.

ALARM COMPARE

FIG. 14 shows one means by which an alarm trigger, ALC, is generated. Each section of main RAM 52 corresponding to the zone I or zone II watch can be multiplexed onto data output bus 60 through multiplexer 354 or 356 by ZAC or $\overline{\text{ZAC}}$ respectively. The contents of the accessed memory cell can then be multiplexed into an alarm comparator by multiplexer 358 by ALARM I/O. A similarly accessed storage cell from the alarm portion of the main RAM is also coupled to comparator circuit 360. Comparator circuit 360 comprises a separate comparator circuit for each bit. One such circuit is shown in FIG. 14. Considering only one bit, the contents from the alarm RAM are coupled via line 362 while the correspondingly accessed bit of the watch zone is coupled to the comparator circuit by line 364. The comparator circuit is comprised of four legs of corresponding P- and N-type devices. Each leg corresponds to one of the four possible of combinations for the pair of lines 362 and 364. The gates of P and N devices are coupled to lines 362 and 364 such that only one of the four legs will be conductive during any given combination, each of the remaining three legs being nonconductive. Thus, when lines 362 and 364 are both true the output of the comparator circuit is coupled to ground through leg 366. Similarly, when lines 362 and 364 are both false the output of the comparator circuit 360 is also coupled to ground. The output of each comparator circuit 360 is then inverted by inverter circuitry 366 and coupled to an additional corresponding memory cell 368 within the main RAM. Alarm comparison memory cell 368 is used as an alarm compare RAM and does not form part of the alarm storage RAM portion. If a comparison is made between the accessed cell and the value stored in the alarm RAM cell, a one will be stored within the corresponding alarm compare storage cell 368. Since the output from alarm compare cell 368 is tapped after the first inverter stage 370, a true comparison stored within cell 368 will provide a false output to NOR gate 372. When each of the cells corresponding to hours, minutes tens and minutes units indicate a true comparison the output of NOR gate 372 will be true indicating an alarm trigger. The output of NOR gate 372 is provided as an input to NOR gate 374 whose other input is one of the digit scan signals, for example, DG6. The output of NOR gate 374 will then be true and no alarm trigger can be generated until DG6 goes true. The false output from NOR gate 374 will then be coupled to 372 to allow an alarm trigger, ALC, to be generated. Thus, no alarm trigger can be generated until all the digits have been cycled. This provision is made to avoid spurious alarm triggers due to the fact that lower order digits roll over one T clock period before the next higher order digit is incremented. Therefore, for one clock period it internally appears to the clock that the time is set back and an inadvertent alarm trigger could be generated but for the precautions incorporated by NOR gate 374.

Although the present invention has been described in regard to a specific embodiment, it must be clearly understood that the embodiment which is described in detail is only for the purposes of illustration and does not limit the spirit or scope of the present invention. What has been described is an integrated circuit watch based upon a PLA and RAM which includes a processor and storage RAM for multiple watch zones. The combination of a processor and flag RAM allows flexible, user programmability. For example, in the illustrated embodiment the user can arbitrarily program between a normal display of hours, minutes, seconds or hours, minutes, and date; can choose between a 12 or 24 hour operation in either zone watch; can convert one of the zone watches to a stopwatch; and can make an arbitrary choice between one of two different stopwatches. User programmability in the present case is provided by the timed closure of one of three switches normally used to manipulate the watch functions. Thus, a large number of arbitrarily programmable user options can be accessed without increasing the number of control switches. The present invention is also capable of achieving even greater flexibility than that illustrated by the presently described embodiment by being capable of including even a greater degree of user programmability. For example, by use of the present invention it would be possible for the user to program a larger number of zones than two with equal ease. In addition, it would be possible for the user to arbitrarily program the watch or stopwatch configuration desired. In other words, using a basic set of instructions it would be possible for the user to write a program into the watch to obtain one of a large number of possible timekeeping combinations and thus, create his own zone watches or stopwatch configurations according to his specific and individual needs.

We claim:

1. A timekeeping circuit in an integrated circuit watch having a main random access memory for storing binary words and having a programmable logic array coupled to said main random access memory for selectively implementing timekeeping operations, said timekeeping circuit comprising:

a flag random access memory coupled to said programmable logic array for selectively storing a plurality of sets of flag bits, one or more of said flag bits being selectively transmitted to said programmable logic array for use during implementation of timekeeping operations; and a processor coupled to said flag random access memory to process said plurality of sets of flag bits in response to a mode selection signal, whereby a plurality of watch modes and functions are efficiently accomodated within said timekeeping circuit in a minimum amount of chip space, and whereby said integrated circuit permits user selection of watch functions.

2. The timekeeping circuit of claim 1 further comprising control means for selectively generating a plurality of address and control signals for said processor and flag RAM, said control means generating said plurality of address and control signals in response to at least one instruction.

3. The timekeeping circuit of claim 2 wherein a plurality of instructions are provided to said control means, said instructions being combinations of timed and sequenced activations of a plurality of switches.

4. The timekeeping circuit of claim 2 wherein said control means includes a plurality of state counters, each said state counter generating a set of state signals indicative of a watch mode.

5. The timekeeping circuit of claim 4 wherein one said watch mode is an alarm mode and wherein a sensate alarm signal is selectively generated by said timekeeping circuit when said integrated circuit watch is in an armed state.

6. The timekeeping circuit of claim 4 wherein time delay request signals are generated in response to selected one of said state signals generated by said state counters, and wherein said contol means includes time delay means for generating after a selected delay a time delay reset signal corresponding to each said time delay request signal generated by said state counter, said time delay reset signal configuring a selected state counter to a predetermined state.

7. The timekeeping circuit of claim 6 wherein said selected delay is achieved by decrementing a constant value stored within said main random access memory at one of a plurality of rates as selected in response to said time delay request signal.

8. The timekeeping circuit of claim 1 wherein said processor is comprised of at least one inverter having an output and having an input responsive to said one instruction and including enabling means for selectively disabling and enabling said inverter.

9. The timekeeping circuit of claim 8 wherein said inverter has a transmission gate said transmission gate being coupled between said output and input of said inverter.

10. The timekeeping circuit of claim 9 wherein the terminal of said transmission gate coupled to said input of said inverter has a dynamic capacitive storage.

11. The timekeeping circuit of claim 8 wherein said inverter has data means for selectively setting said output of said inverter to a predetermined logic value.

12. An improvement in an integrated circuit watch, including a main random access memory for storing a plurality of addressable binary words and including a programmable logic array coupled to said main RAM to selectively increment said binary words, to compare said binary words against a limit value, to generate an output binary word, and to generate a carry signal if appropriate, said improvement comprising:

control means for generating a plurality of distinguishable states, each said state corresponding to a watch mode and configuration, said main random access memory being addressed in response to at least one of said plurality of distinguishable states, indicative of said plurality of distinguishable states and generated by said control means, said control means selectively generating a plurality of time delay request signals; and time delay means for generating after a selected timed delay, a plurality of time delay reset signals corresponding to said plurality of time delay request signals, said time delay reset signals being coupled to said control means to selectively configure said control means to a selected one of said plurality of distinguishable states, whereby user programmability is provided by said integrated circuit watch.

13. The improvement of claim 12 wherein said control means generates said time delay reset signals by simultaneous activation of one of a plurality of switches with one of said plurality of distinguishable states for a duration determined in response to said time delay request signal corresponding to said time delay reset signal.

14. The improvement of claim 13 wherein said duration is determined by said time delay means in response to said time delay request signal and is obtained by decrementing a constant value stored at a predetermined location within said main random access memory at one of a plurality of rates as selected in response to said time delay request signal.

15. The improvement of claim 12 further comprising:

a flag random access memory coupled to said programmable logic array for selectively storing a plurality of sets of flag bits, said flag bits being selectively coupled to said programmable logic array for use during said selective incrementation, comparison, generation of said carry signal, and generation of said output binary word; and a processor coupled to said flag random access memory to selectively process said plurality of sets of flag bits in response to instruction signals generated by said control means and programmable logic array.

16. The improvement of claim 15 wherein said control means includes:

a normal display state means for generating a plurality of display states corresponding to a plurality of display configurations of said integrated circuit watch;

a stopwatch state means for generating a plurality of stopwatch states corresponding to a plurality of stopwatch configurations of said integrated circuit watch; and a timeset state means for generating a plurality of timeset states corresponding to each of said plurality of display configurations.

17. The improvement of claim 16 wherein one of said display configurations is an alarm display and wherein said main random access memory includes a comparator circuit for comparing a first portion of said main random access memory corresponding to a timekeeping mode to a second portion of said main random access memory corresponding to a stored alarm value, said comparator circuit generating an alarm trigger signal upon equivalence of a plurality of binary words in said first and second portions of said main random access memory.

18. A method for keeping time in a multiplicity of zones in an integrated circuit watch having a main random access memory for storing a plurality of binary words and having a programmable logic array coupled to said main random access memory to implement timekeeping operations, said method comprising the steps of:

selectively accessing a set of flag bits of a plurality of flag bits corresponding to one of said multiplicity of zones, said flag bits stored in a flag random access memory coupled to said programmable logic array;

processing said accessed set of flag bits in a processor coupled to said flag random access memory in response to a plurality of instruction signals from said programmable logic array and from a control means for generating at least some of said instruction signals; and coupling said processed and accessed set of flag bits to said programmable logic array for use in said timekeeping operations, whereby a multiplicity of independent timekeeping functions can be accomodated be a single integrated circuit watch without increased complexity or use of chip space.

19. The method of claim 18 wherein at least some of said flag bits are processed in response to timed and sequenced activation of a plurality of switches.

20. The method of claim 18 wherein said set of flag bits is accessed by control means for selectively generating a plurality of address and control signals in response at least in part to user instructions.

21. The method of claim 20 wherein said control means includes a plurality of state counters, each said state counter generating a set of state signals indicative of a watch mode.

22. The method of claim 21 wherein time delay request signals are generated in response to selected ones of said state signals generated by said state counters and wherein said control means includes time delay means for generating after a selected delay a time delay reset signal corresponding to each said time delay request signal generated by said state counter, said time delay reset signal configuring a selected state counter to a predetermined state.

23. The method of claim 22 wherein said selected delay is achieved by decrementing a constant value stored within a single location with said main random access memory at a plurality of rates as selected by said time delay means in response to said time delay request signals.

24. The method of claim 18 further comprising the steps of:

accessing a first and second portion of said main random access memory, said first portion corresponding to one of said multiplicity of zones and said second portion corresponding to a stored alarm value;

comparing said first and second portion of said main random access memory in a comparator to generate a comparison word; and generating an alarm enable signal when said comparison word is indicative of a complete and valid comparison and an audible alarm signal by a piezoelectric transducer.

25. The method of claim 18 wherein said step of processing said accessed set of flag bits is in a processor comprised of at least one inverter having an output and having an input responsive to said instruction signal and including enabling means for selectively disabling and enabling said inverter.

26. The method of claim 25 wherein said inverter has a transmission gate, coupled between said output and input of said inverter.

27. The mehod of claim 26 wherein said transmission gate has a dynamic capacitive storage.

28. The method of claim 25 wherein said inverter has data means for setting said output of said inverter to a predetermined logic value.

29. A method for keeping time in an integrated circuit watch having a main random access memory for storing a plurality of binary words and having a programmable logic array coupled to said main random access memory to implement timekeeping functions, said method comprising the steps of:

generating one of a plurality of distinguishable states in a control means, each said state corresponding to a watch mode and configuration, said main random access memory being addressed in response at least in part to one of a plurality of state signals indicative of said plurality of distinguishable states and generated by said control means;

generating one of a plurality of time delay request signals by said control means;

generating one of a plurality of time delay reset signals by a time delay means, each said time delay reset signal corresponding to one of said time delay request signals; and coupling said one time delay reset signal to said control means to selectively configure said control means in a selected one of said plurality of distinguishable states, whereby user programmability is provided in said integrated circuit watch by time dependent instructions.

30. The method of claim 29 wherein said time delay reset signals are generated by said control means by simultaneous activation of one of a plurality of switches with one of said plurality of state signals for a duration determined in response to a corresponding one of said time delay request signals.

31. The method of claim 30 wherein said duration is determined by said time delay means in response to said time delay request signal and is obtained by decrementing a constant value stored at a predetermined location within said main random access memory at one of a plurality of rates as selected in response to said time delay request signal.

32. The method of claim 29 further comprising the steps of:

selectively accessing a set of flag bits of a plurality of flag bits corresponding to a multiplicity of zone watches in said main random access memory, said plurality of flag bits being stored in a flag random access memory coupled to said programmable logic array; and selectively processing said accessed set of flag bits in a processor coupled to said flag random access memory in response to a plurality of instruction signals, whereby a multiplicity of zone watches are accomodated without complex control requirements and with a minimum amount of chip space.

33. The method of claim 32 wherein at least some of said instruction signals are generated by said control means in response to user instructions.

34. The method of claim 32 further comprising the steps of:

accessing a first and second portion of said main random access memory, said first portion corresponding to one of said multiplicity of zones and said second portion corresponding to a stored alarm value;

comparing said first and second portion of said main random access memory in a comparator to generate a comparison word; and generating an alarm enable signal when said comparison word is indicative of a complete and valid comparison.

35. A processor in an integrated circuit watch, and coupled to a memory, said processor comprising:

at least one tristate inverter having an output and having an input responsive to an instruction signal and including enabling means for selectively disabling and enabling said inverter, said output of said inverter being selectively coupled to said memory, said inverter having a transmission gate directly coupled between said output and input of said inverter, said transmission gate being gated by a first timing signal.

36. The processor of claim 35 wherein said transmission gate has a dynamic capacitive storage associated therewith and wherein said output is coupled to said memory on a second timing signal subsequent to said first timing signal.

37. The processor of claim 35 wherein said inverter has data means for selectively setting said output at a predetermined logic value.

* * * * *